United States Patent
Maddox et al.

(10) Patent No.: US 9,641,189 B2
(45) Date of Patent: May 2, 2017

(54) CALIBRATION TECHNIQUES FOR SAR ADCS WITH ON-CHIP RESERVOIR CAPACITORS

(71) Applicant: ANALOG DEVICES, INC., Norwood, MA (US)

(72) Inventors: Mark D. Maddox, Derry, NH (US); Michael Coln, Lexington, MA (US); Gary R. Carreau, Plaistow, NH (US); Baozhen Chen, Woburn, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 14/747,071

(22) Filed: Jun. 23, 2015

(65) Prior Publication Data
US 2016/0182077 A1 Jun. 23, 2016

Related U.S. Application Data

(60) Provisional application No. 62/093,407, filed on Dec. 17, 2014.

(51) Int. Cl.
*H03M 1/12* (2006.01)
*H03M 1/10* (2006.01)
*H03M 1/46* (2006.01)

(52) U.S. Cl.
CPC ....... *H03M 1/1071* (2013.01); *H03M 1/1038* (2013.01); *H03M 1/462* (2013.01); *H03M 1/468* (2013.01)

(58) Field of Classification Search
CPC ...... H03M 1/804; H03M 1/0863; H03M 1/38; H03M 1/46; H03M 1/806; H03M 1/0845; H03M 1/1245

(Continued)

(56) References Cited

U.S. PATENT DOCUMENTS 6,433,724 B1 * 8/2002 Confalonieri ......... H03M 1/068
341/155
8,344,931 B2 1/2013 Zhu et al.
(Continued)

OTHER PUBLICATIONS

Jan Craninckx et al., A 65fJ/Conversion-Step 0-to-60MS/s 0-to-0.7mW 9b Charge-Sharing SAR ADC in 90nm Digital CMOS, ISSCC 2007 / Session 13 / ΔΣ ADCs and Converter Techniques / 13.5, 2007, IEEE International Solid-State Circuits Conference, 1-4244-0852-0/07 © 2007, 3 pages.
(Continued)

*Primary Examiner* — Linh Nguyen
(74) *Attorney, Agent, or Firm* — Patent Capital Group

(57) ABSTRACT

When reservoir capacitors are moved on-chip for individual bit decisions, a successive approximation register analog-to-digital converter (SAR ADC) has an addition source of error which can significantly affect the performance of the SAR ADC. Calibration techniques can be applied to measure and correct for such error in an SAR ADC using decide-and-set switching. Specifically, a calibration technique can expose the effective bit weight of each bit under test using a plurality of special input voltages and storing a calibration word for each bit under test to correct for the error. Such a calibration technique can lessen the need to store a calibration word for each possible output word to correct the additional source of error. Furthermore, another calibration technique can expose the effective bit weight of each bit under test without having to generate the plurality of special input voltages.

26 Claims, 27 Drawing Sheets

(58) Field of Classification Search
USPC .................. 341/155, 158, 172, 118, 120
See application file for complete search history.

(56) References Cited

U.S. PATENT DOCUMENTS

| | | | |
|---|---|---|---|
| 8,390,502 B2 | 3/2013 | Kapusta | |
| 2006/0244647 A1* | 11/2006 | Takano | H03M 1/804 341/144 |
| 2010/0052957 A1 | 3/2010 | Craninckx | |
| 2010/0265113 A1* | 10/2010 | Yoshioka | H03M 1/002 341/150 |
| 2012/0081243 A1* | 4/2012 | Kim | H03M 1/0678 341/110 |
| 2012/0112938 A1* | 5/2012 | Haneda | H03M 1/12 341/110 |
| 2012/0154194 A1* | 6/2012 | Chang | H03M 1/002 341/158 |
| 2012/0182166 A1 | 7/2012 | Haneda | |
| 2012/0242523 A1 | 9/2012 | Kapusta | |
| 2012/0274488 A1* | 11/2012 | Kapusta | H03M 1/0845 341/110 |
| 2013/0015996 A1* | 1/2013 | Furuta | H03M 1/06 341/172 |
| 2014/0045444 A1* | 2/2014 | Furuta | H03M 1/1245 455/230 |
| 2014/0085118 A1* | 3/2014 | Tsai | H03M 1/462 341/122 |
| 2014/0197971 A1* | 7/2014 | Kuppambatti | G06F 1/08 341/110 |
| 2014/0203958 A1* | 7/2014 | Okuda | H03M 1/124 341/172 |
| 2014/0266847 A1* | 9/2014 | Shen | H03M 1/38 341/158 |
| 2015/0061913 A1* | 3/2015 | Wang | H03M 1/142 341/172 |
| 2015/0249463 A1* | 9/2015 | Alladi | H03M 1/1245 341/150 |
| 2016/0182078 A1 | 6/2016 | Shen | |

OTHER PUBLICATIONS

Yan Zhu et al., "A 10-bit 100-MS/s Reference-Free SAR ADC in 90 nm CMOS", IEEE Journal of Solid-State Circuits, vol. 45, No. 6, Jun. 2010, 0018-9200 © 2010 IEEE, pp. 1111-1121 (11 pages).

Jon Guerber et al., "Enhanced SAR ADC Energy Efficiency from the Early Reset Merged Capacitor Switching Algorithm", 978-1-4673-0219-7/12 © 2012, IEEE, pp. 2361-2364 (4 pages).

Ron Kapusta et al., "A 14b 80 MS/s SAR ADC With 73.6 dB SNDR in 65 nm CMOS", IEEE Journal of Solid-State Circuits, vol. 48, No. 12, Dec. 2013, 0018-9200 © 2013 IEEE, pp. 1-8 (8 pages).

Brian P. Ginsburg et al., "An Energy-Efficient Charge Recycling Approach for a SAR Converter With Capacitive DAC", 0-7803-8834-8/05 © 2005 IEEE, pp. 184-187 (4 pages).

Chun-Cheng Liu et al., "A 0.92mW 10-bit 50-MS/s SAR ADC in 0.13 µm CMOS Process", 978-4-86348-010-0, 2009 Symposium on VLSI Circuits Digest of Technical Papers, pp. 236-237 (2 pages).

Yu Meng et al., "An 8 bit 12 MS/s Asynchronous Successive Approximation Register ADC With an On-Chip Reference", Journal of Semiconductors, vol. 34, No. 2, Feb. 2013, 5 pages.

U.S. Appl. No. 14/949,423, filed Nov. 23, 2015.

OA1 issued in U.S. Appl. No. 14/949,423 mailed Apr. 5, 2016, 13 pages.

OA2 (Final) issued in U.S. Appl. No. 14/949,423 mailed Aug. 15, 2016, 15 pages.

* cited by examiner

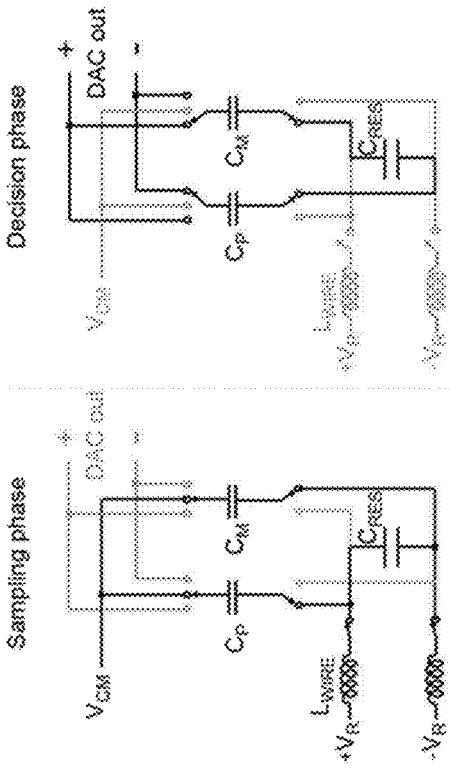
FIGURE 2A  FIGURE 2B
FIGURE 3A  FIGURE 3B
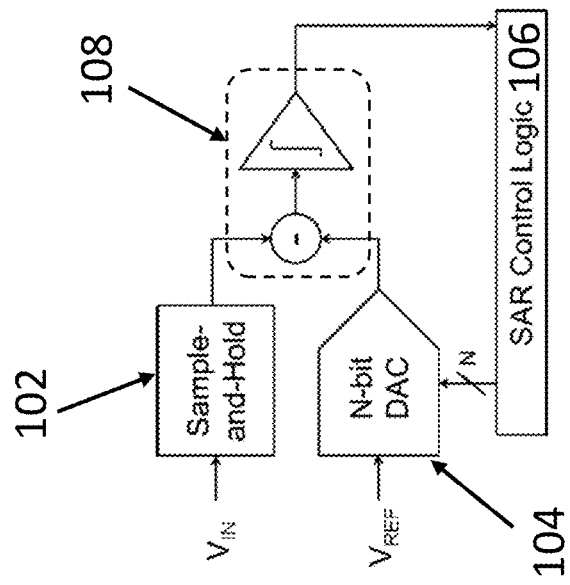
FIGURE 1

CALIBRATION TECHNIQUES FOR SAR ADCS WITH ON-CHIP RESERVOIR CAPACITORS

PRIORITY DATA

This application is a non-provisional and claims the benefit of U.S. Provisional Patent Application Ser. No. 62/093,407 filed Dec. 17, 2014, which is hereby incorporated by reference in its entirety.

TECHNICAL FIELD OF THE DISCLOSURE

The present invention relates to the field of integrated circuits, in particular to calibration techniques for successive-approximation register analog-to-digital converters (SAR ADCs).

BACKGROUND

In many electronics applications, an analog input signal is converted to a digital output signal (e.g., for further digital signal processing). For instance, in precision measurement systems, electronics are provided with one or more sensors to make measurements, and these sensors may generate an analog signal. The analog signal would then be provided to an analog-to-digital converter (ADC) as input to generate a digital output signal for further processing. In another instance, an antenna generates an analog signal based on the electromagnetic waves carrying information/signals in the air. The analog signal generated by the antenna is then provided as input to an ADC to generate a digital output signal for further processing.

ADCs can be found in many places such as broadband communication systems, audio systems, receiver systems, etc. ADCs can translate analog electrical signals representing real-world phenomenon, e.g., light, sound, temperature or pressure for data processing purposes. Designing an ADC is a non-trivial task because each application may have different needs in performance, power, cost and size. ADCs are used in a broad range of applications including communications, energy, healthcare, instrumentation and measurement, motor and power control, industrial automation and aerospace/defense. As the applications needing ADCs grow, the need for accurate and reliable conversion performance also grows.

Generally speaking ADCs are electronic devices that convert a continuous physical quantity carried by an analog signal to a digital number that represents the quantity's amplitude (or to a digital signal carrying that digital number). An ADC is typically composed of many devices making up an integrated circuit or a chip. An ADC can be defined by any one or more of the following application requirements: its bandwidth (the range of frequencies of analog signals it can properly convert to a digital signal), its resolution (the number of discrete levels the maximum analog signal can be divided into and represented in the digital signal), its linearity (e.g., how well the output data is proportionate to the input signal), and its signal to noise ratio (how accurately the ADC can measure signal relative to the noise the ADC introduces). Analog-to-digital converters (ADCs) have many different designs, which can be chosen based on the application requirements.

SUMMARY OF THE DISCLOSURE

Usually, an ADC measures an input against a reference, which can be embodied in the form of a reference charge being pulled from the reference. For a successive-approximation register analog-to-digital converter (SAR ADC) which performs a series of bit decisions, the reference charge can be pulled from the reference during each bit decision. The reference charge being used during bit decisions is often pulled at a particular rate of the ADC. To accommodate faster rates of ADCs, the charge is usually provided by adding an external low equivalent series resistance (ESR) capacitor between the reference and the ADC. The low ESR capacitor acts as an external charge "reservoir" which can support the instantaneous requirements of the ADC. The reference then serves the function of recharging this external reservoir capacitor. The charge being used during bit decisions are typically provided from the external reservoir capacitor to the ADC over bond wires, which can impede the speed of each bit decision, and thus the overall speed of the SAR ADC.

When reservoir capacitors are moved on-chip for individual bit decisions, a successive approximation register analog-to-digital converter (SAR ADC) has an addition source of error which can significantly affect the performance of the SAR ADC. Calibration techniques can be applied to measure and correct for such error in an SAR ADC using decide-and-set switching. Specifically, a calibration technique can expose the effective bit weight of each bit under test using a plurality of special input voltages and storing a calibration word for each bit under test to correct for the error. Such a calibration technique can lessen the need to store a calibration word for each possible output word to correct the additional source of error. Furthermore, another calibration technique can expose the effective bit weight of each bit under test without having to generate the plurality of special input voltages.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIG. 1 is a system architecture for a SAR ADC, according to some embodiments of the disclosure;

FIGS. 2A-B illustrates switching behavior for an SAR ADC having an external, off-chip reservoir capacitor;

FIGS. 3A-3B illustrates switching behavior for an SAR ADC having on-chip reservoir capacitors, according to some embodiments of the disclosure;

DESCRIPTION OF EXAMPLE EMBODIMENTS OF THE DISCLOSURE

Understanding SAR ADCs

Figure 4B:
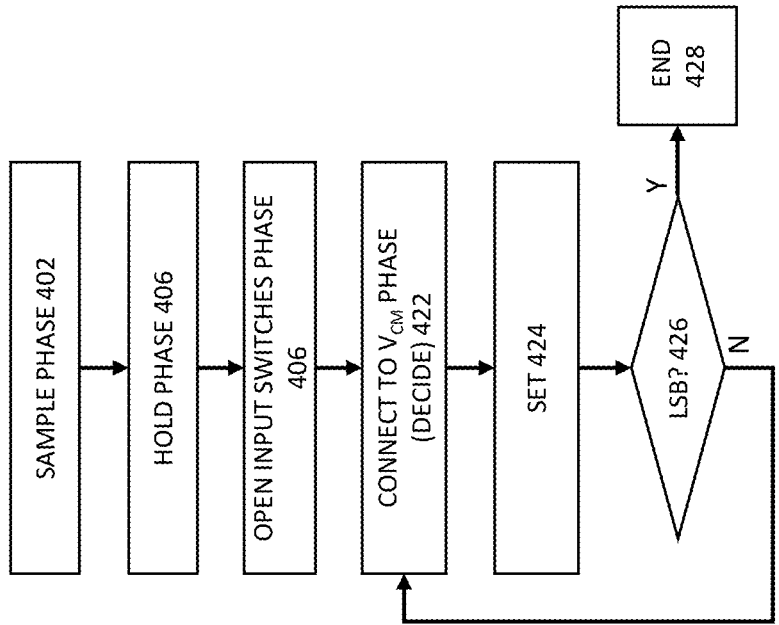
FIG. 4B shows a flow diagram illustrating an exemplary "decide-and-set" switching procedure for use in an SAR ADC, according to some embodiments of the disclosure.

Analog-to-digital converters (ADCs) can come in many different designs. One design is the successive approximation register analog-to-digital converter (SAR ADC). An SAR ADC (or sometimes referred simply as "SAR") tend to provide high resolution (e.g., generate a high number of bits) while having reasonable speed. For that reason, SAR ADCs are used in many applications.

Fundamentally, the SAR ADC implements a charge balancing process. The SAR ADC measures the input by acquiring a charge (representative of the input voltage) onto a set of bit capacitors (or "bit caps" for short). The SAR ADC then implements an algorithm to cancel out the charge using known elements having respective bit trial weights (i.e., known elements of charge). From the pattern of bit trial weights that was applied, it is possible to infer what the original charge was, e.g., the sum of the trial weights can represent the original charge. SAR ADCs usually implement a binary search algorithm for inferring the original charge representative of the sampled input. At a circuit level, an SAR ADC has an array of capacitors (e.g., a binary weighted array), then a comparator can determine residual difference between an estimated value and the initially acquired value. Finally, a plurality switches can manipulate charge and switch charge around between different capacitors. A digital engine (or digital logic) can implement the binary search algorithm.

FIG. 1 is a system architecture for a SAR ADC, according to some embodiments of the disclosure. As shown, the functional N-bit SAR ADC block diagram includes a sample-and-hold part 102, an N-bit digital-to-analog converter (DAC) part 104, a comparator part 108, and an SAR control logic part 106. The sample-and-hold part 102 samples the input $V_{IN}$, and the output of the sample-and-hold part 102 is compared with the output of the N-bit DAC part 104. Based on the output of the comparator ("the comparator decision"), the SAR control logic part 106 updates the DAC code being fed back to the N-bit DAC part 104. The output of the N-bit DAC part 104 fully settles before the comparator can make its next decision. Effectively, a discrete-time negative feedback loop is formed which forces the output of the N-bit DAC part 104 to equal the sampled input $V_{IN}$. At a high level, N bit decisions are performed for an N-bit SAR ADC to generate N bits, and each decision is ideally accurate to the full resolution of the converter. The inherent sequential nature of the SAR ADC algorithm makes it difficult to provide extremely fast conversion while providing high accuracy because the overall speed of conversion is critically limited by the speed of each bit trial.

One possible way to increase the speed of each bit decision is by reducing the settling time of each bit decision, so that the overall conversion process can perform all the bit decisions faster. In some designs, the reference voltage $V_{REF}$ of the N-bit DAC 104 is provided off-chip (external to the integrated circuit package that provides the SAR ADC functions). FIGS. 2A-B illustrates switching behavior for an SAR ADC having an external, off-chip reservoir capacitor. When a capacitor in the N-bit DAC 104 is switched to the reference voltage (in this example illustrated as $+V_R$ and $-V_R$) to generate a decision threshold (illustrated by decision phase of FIG. 2B), charge is drawn from the off-chip reference (e.g., an off-chip reservoir capacitor) over a bond wire having inductance $L_{WIRE}$ as seen in the figures. The charge transfer through the wire inductance can cause ringing, which can affect the minimum amount of time needed to guarantee the settling of the N-bit DAC 104 output.

To alleviate the above-mentioned issue, the off-chip reference can be effectively moved on-chip for internal charge redistribution. Within the context of the disclosure, "on-chip" means a device is provided on the same semiconductor substrate as the SAR ADC. FIGS. 3A-3B illustrates switching behavior for an SAR ADC having on-chip reservoir capacitors, according to some embodiments of the disclosure. Typically, an on-chip reservoir capacitor is provided for each bit of the SAR ADC, in the manner illustrated by the circuit shown in the figures. The figures show that, for each bit of the SAR ADC, an on-chip reservoir capacitor $C_{RES}$ can be provided to acquire all of the charge to be used for a complete conversion before the conversion begins. A differential implementation is shown, where during the sampling phase (illustrated by FIG. 3A), capacitors $C_P$ and $C_M$ are connected to the reference voltage, while a relatively large on-chip reservoir capacitor $C_{RES}$ is differentially charged to the references through series reference switches. Although charging of the capacitors occurs through wire inductance and ringing is expected, the sampling phase is sufficiently long enough to not be impeded by the ringing significantly. During the decision phase (illustrated by FIG. 3B), the series reference switches are opened, thus disconnecting the DAC from the off-chip reference. DAC capacitors $C_P$ and $C_M$ are cross-connected to opposite polarities of $C_{RES}$, delivering reference charge to the DAC output. Since the reference charge is drawn directly from the on-chip reservoir capacitor $C_{RES}$, and not from an off-chip reference, the charge redistribution path is now on-chip, and ringing (if any) is significantly limited. By having on-chip reservoir capacitors, the settling time is improved. An exemplary SAR ADC having on-chip reservoir capacitors is described in U.S. Pat. No. 8,390,502 (Inventor: Ronald Kapusta), which is hereby incorporated by reference in its entirety.

SAR ADC Using Conventional Switching Versus Decide-and-Set Switching

In a conventional SAR algorithm, the following illustrative steps can be taken, as described in relation to a differential ADC having two capacitor DACs (DACP and DACN). FIG. 4A shows a flow diagram illustrating such conventional switching procedure for use in an SAR ADC. In its most simplified form, the capacitor DACs have an array of bit caps. The steps for the bit trials are followed starting with the most significant bit (MSB) all the way down to the least significant bit (LSB).

1) SAMPLE PHASE (box 402): The SAR ADC tracks the analog input signal by connecting the bottom plates of some number of bit caps to that input while the top-plate of those same bit caps are tied to some low impedance direct current (DC) voltage source. The DC signal provided by the low impedance DC voltage source is typically half of the reference voltage ($V_{REF}$) being used by the ADC. This DC voltage is sometimes referred to as $V_{CM}$ (common-mode voltage), and $V_{CM}$ gets connected to the top-plate of these bit caps through the sample switch. The analog input is connected to the bottom plates through the input switches.

2) HOLD PHASE (box 404): When ready to perform an analog-to-digital conversion, the sample switches are opened to trap charge on the bit caps that is representative of the analog input at that point in time.

3) OPEN INPUT SWITCHES PHASE (box 406): The input switches are then opened to disconnect the bottom plates of the bit caps from the input.

4) CONNECT TO $V_{REF}$ PHASE (box 408): The bottom plate of the MSB bit cap in DACP is connected to $V_{REF}$, and bottom plate of the MSB cap in DACN is connected to ground. At the same time, the bottom plates of the bit caps in DACP of the lower bits are connected to ground, and bottom plates of the bit caps in DACN of the lower bits are connected to $V_{REF}$.

5) DECISION PHASE (diamond 410): CONNECT TO $V_{REF}$ AND GROUND PHASE forces the top plate nodes (which are the inputs to a comparator) to have a difference voltage (between them) which is proportional to the analog input. The comparator can then determine if the MSB is to be "kept" (bottom plate tied to $V_{REF}$) or "thrown" away (bottom-plate switched to ground), shown as box 414 and 412 respectively.

6) Once the bottom plate of the MSB gets tied to the appropriate voltage, the bottom plate of the next bit (MSB-1) can be tied to $V_{REF}$. The top plate nodes again move and the comparator then decides what to do with the bottom plate of this bit (i.e., leave it tied as it presently is or to switch it to the other voltage), shown as returning to box 408. This process of testing a bit (box 408 and 410) and keeping it (box 414) or throwing it away (412) continues until the algorithm gets to the LSB (illustrated by diamond 416 and box 418).

As described above, sampling and decision phases for all bit decisions can involve a lot of switching of the array of capacitors. Switching the array of capacitors can consume a lot of power, especially when the above SAR algorithm is used. To reduce the amount of power needed for the conversion, a different switching technique can be used.

Figure 4A:
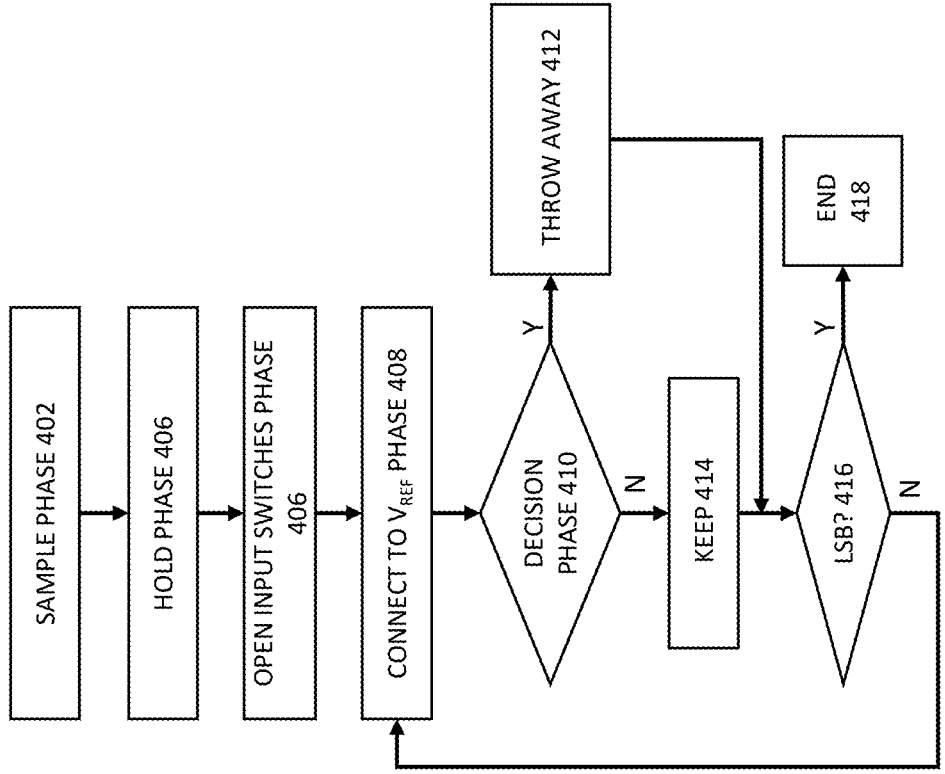
FIG. 4A shows a flow diagram illustrating a conventional switching procedure for use in an SAR ADC.

FIG. 4B shows a flow diagram illustrating an exemplary "decide-and-set" switching procedure for use in an SAR ADC, according to some embodiments of the disclosure. When compared with the conventional SAR algorithm, "decide-and-set" reduces the amount of switching and thus effectively decreases the power consumed. The decide-and-set switching procedure determines the sign of the differential input (MSB) by connecting the differential arrays to $V_{CM}$ (box 422). At the instant the back plate of two capacitors are connected together, the input to the comparator "changes" and the comparator can decide how to configure the bottom plate of the MSB (i.e., to either REFP or to REFN). Once the MSB bottom plate has been connected, this will again change the comparator input and provide information as to how to configure the bottom plate of the MSB-1. Effectively, the decision is made (box 422) and the next bit is set (box 424), hence the "decide-and-set" switching. The power dissipation is derived from just what is needed to drive the bottom-plate parasitic of the capacitive arrays. The procedure continues until the algorithm gets to the LSB (illustrate by diamond 426 and box 428). The important features of decide-and-set switching is that the procedure foresees the "up" or "down" transitions (e.g., keeping it or throwing it away) after the comparator determines the bit and not before. For this reason, the procedure does not require pre-charging of capacitors and, possibly, discharging after the bit decision. Therefore, the performed charge redistribution is just what is required without wasting power. The additional cost of the procedure can include additional switches usable for resetting the capacitors to a common-mode voltage.

Combining the Use of on-Chip Reservoir Capacitors with Decide-and-Set Switching

An SAR ADC having on-chip reservoir capacitors can utilize different SAR algorithms, depending on the application. For instance, an SAR ADC having on-chip reservoir capacitors can use decide-and-set switching to reduce power consumption. The following describes some illustrative steps performed during the conversion process.

1) The input $V_{in}$ (differentially $V_{in}+$ and $V_{in}-$, sometimes denoted as IN+ and IN− terminals) is sampled typically against a common-mode voltage CompCM for the comparator onto the bottom plates of bit caps in DACP. Phrased differently, a value of $V_{REF}-V_{in}$ is sampled onto the bottom plates of bit caps of DACN in a differential configuration. During the time that the input is being sampled a set of on-chip reservoir capacitors are being charged to the external reference voltage $V_{REF}$. These reservoir capacitors, one per bit, are to be used by DACP and DACN during the SAR process as the required reference REF+ and REF−. The reservoir caps can be placed differentially during the SAR process in between the two DACs and are therefore shared by the two DACs. The bottom plate arrangement for a DAC using decide-and-set switching differs from a conventional SAR algorithm in that there are four bottom plate switches (i.e., switches that are directly connected to the bottom plate) as opposed to three switches. The four switches connect the bottom plates to either $V_{in}$, REF+, REF−, or they short the bottom plate of the bit caps between DACP and DACN.

2) After the signal acquisition phase is made to complete by assertion of a 'Convert Start' signal, the top plate node of both DACs can disconnect from the common-mode voltage CompCM, the bottom plate switches can be configured to disconnect from the input signal and short across the two DACs.

3) The reservoir capacitors disconnect their top and bottom plates from the external reference and float.

4) When the bottom plates get shorted across DACP and DACN, a displacement of the top-plate nodes from CompCM by an amount and in a direction relative to Vin+ and Vin− results. The comparator can then make a decision based on its two inputs as to how to place or insert the MSB reservoir capacitor in between the MSB bottom plate of DACP and DACN. The shorting switches for the MSB's can be removed and the reservoir capacitor can be placed either right-side up or upside down based on the comparator decision and the SAR will update its MSB accordingly.

5) The action of placing the MSB reservoir capacitor into the DAC can affect the voltage difference between the top plate nodes (topp and topn) and this new value for this difference can now be used by the comparator to decide how the MSB-1 reservoir capacitor should be set into the array, hence the term "decide and set" for describing this switching algorithm.

6) With that information, the SAR engine can remove the shorting switch between the bottom plates of the two MSB-1 capacitors and now insert the reservoir capacitor in the proper orientation (right side up or upside down). This process of determining how to sequentially connect in the reservoir capacitors continues until all the bits (that have reservoir caps) are determined.

The Trade-Off of Having on-Chip Reservoir Capacitors

On-chip reservoir capacitors act as on-chip sources of energy or charge that is used during the individual bit decisions that occur during the analog-to-digital conversion. The use of on-chip reservoir capacitors no longer requires that the charge come from an off-chip reference through bond wires which tend to impede or slow down the transfer of that charge. The use of reservoir capacitors has a trade-off in that reservoir capacitors are an additional source of error for the ADC due to their limited charge storage capability. Because the different reservoir capacitor bits are applied from MSB downward, the conversion process changes the topology incrementally during the conversion process, and the charge being drawn from the reservoir capacitors are no longer so well controlled. Aside from manufacturing tolerances, there are systematic and significant perturbations in the effective weights of the bits that has to be taken into account. The reservoir capacitors are typically binarily weighted and made larger than the bit capacitors that they are associated with. This will result in a binary weighted array of reservoir capacitors. It is not trivial to measure the magnitude of the error associated with each bit that is to be corrected through a calibration word.

The linearity of an ADC is typically determined by comparing the obtained ADC code against the desired ADC code over the entire transfer function of the ADC. One of the factors that can produce a difference between the obtained code and the actual code is a mismatch between the binary ratios of the bit caps associated with determining the obtained code. In a system that uses reservoir capacitors as the references for the ADC, an added source of error is produced due to their finite amount of charge storage that can affect the linearity in the same manner as a bit weight error but potentially to a much larger degree. The use of reservoir capacitors in an SAR ADC can, in some cases, complicate the required calibration process. When a reservoir capacitor is used for each bit, the output would depend on what charge that was taken out for the previous bit trial. Calibration by code could result, i.e., each pattern of bit trial result would each have its own unique calibration coefficient. If not done efficiently, calibration word per ADC code might be required, which can result in a prohibitively large number of calibration words and therefore a large amount of memory to store those calibration words. For example, if 7 bits of a 16-bit ADC are using reservoir capacitors and are to be calibrated it can be shown that 127 calibration words may be needed.

Calibration of SAR ADC with on-Chip Reservoir Capacitors and Using Decide-and-Set Switching Perhaps not so obvious is that using decide-and-set switching can simplify the calibration method by only requiring a calibration word per bit, when a calibration technique can be designed to expose the error that would be present during the conversion. If the same SAR ADC is using the decide-and-set method, it would require only 7 calibration words. Predetermining the required calibration coefficients can simply involve the measurement of the error term associated with each reservoir capacitor and bit capacitor pair.

Figure 5:
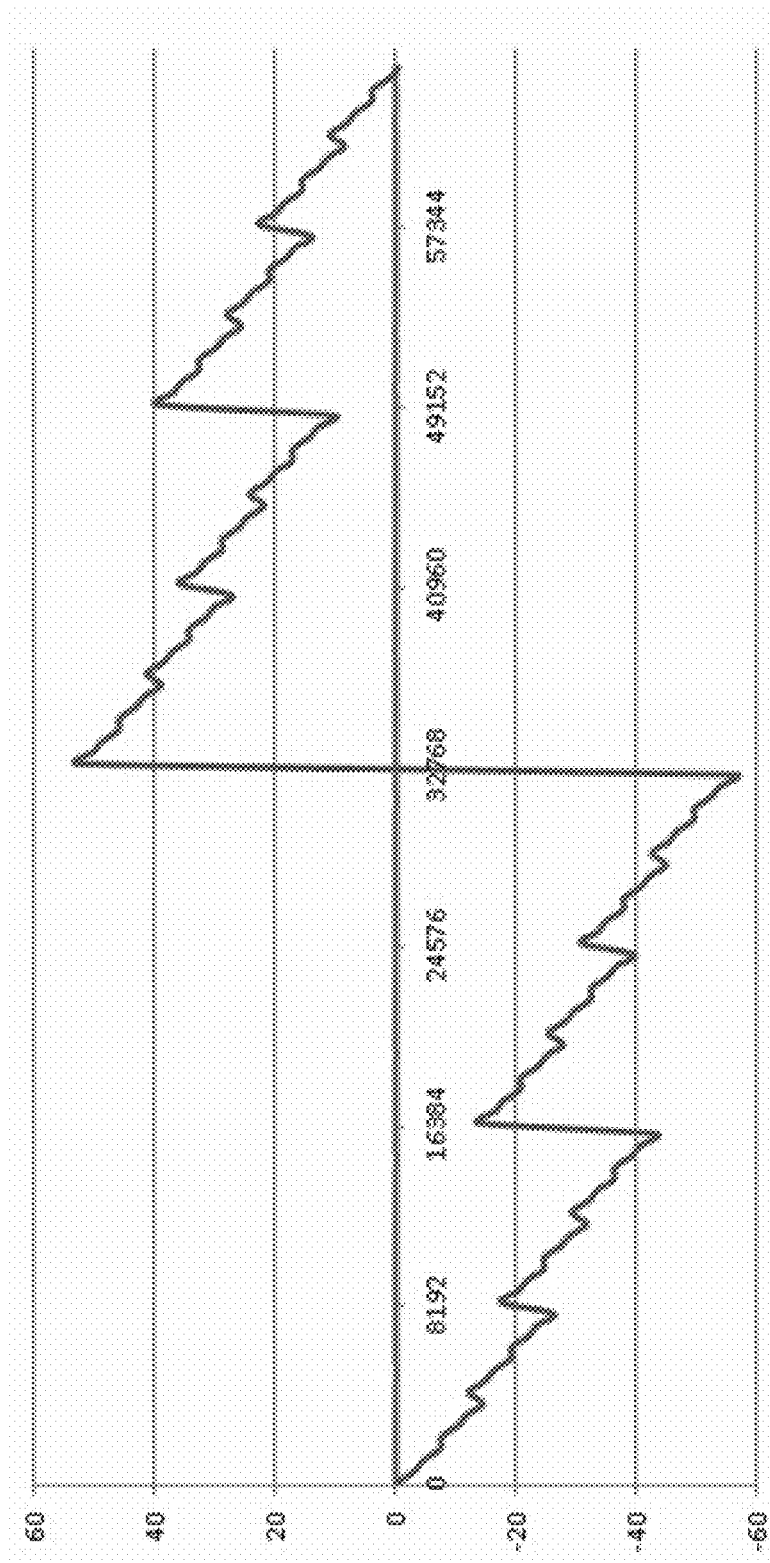
FIG. 5 shows a plot of untrimmed integral non-linearity for a SAR ADC having on-chip reservoir capacitors using decide-and-set switching, according to some embodiments of the disclosure.

FIG. 5 shows a plot of integral non-linearity for a SAR ADC having on-chip reservoir capacitors using decide-and-set switching, according to some embodiments of the disclosure. The plot of the linearity error of an ADC that shows a discontinuity or step in the plot at the code where the error is introduced. A detailed analysis of these steps reveals that in a system using reservoir capacitors of finite size more than one of the bits of the ADC could be contributing to the magnitude and direction of that step. These steps can occur at input voltages that are integer fractions of $V_{REF}$ such as $V_{REF}/2$, $V_{REF}/4$, $V_{REF}/8$, $V_{REF}/16$, $3V_{REF}/4$, $5V_{REF}/8$, etc. The largest step in an architecture of this type can occur in the middle of the transfer function when the two inputs are at $V_{REF}/2$ and it can be shown that all of the bits using reservoir capacitors are contributing to the size of this step. The steps at $V_{REF}/4$ and at $3V_{REF}/4$ are due to the MSB-1 and all bits below that which are using reservoir caps. The steps at $V_{REF}/8$ and $5V_{REF}/8$ are due to the MSB-2 and all bits below that, etc. When the error at step $V_{REF}/4$ is removed, the error at $3V_{REF}/4$ can ideally also get removed. This can occur automatically if the size of the two errors are identical because all the contributing error sources at the two points were the same. Effectively, symmetry of the steps on either side of the MSB error at $V_{REF}/2$ will minimize the effort required to calibrate out all errors.

Overview of Two Techniques for Calibrating the Error

To calibrate the bit weight errors, the present disclosure describes techniques for measuring bit weight errors of the SAR ADC using decide-and-set switching and having on-chip reservoir capacitors being used in individual bit decisions. Specifically, techniques are designed to be unique to SAR ADCs that use decide-and-set switching because the procedure is designed to follow the decide-and-set switching conversion process to expose the effective weight of the bits of the SAR ADC. The techniques generally forces the SAR ADC to perform a series of bit trials, perform some digital post processing in the results of the bit trials, and infer from the results of the bit trials what the error term must have been. The decide-and-set switching technique can in some cases lend itself better to calibration of these bit weight errors than the conventional SAR algorithm but can pose some challenges on how to easily measure the errors that need to be calibrated out. The measured errors can allow error coefficients to be determined. The error coefficients can be used, e.g., in digital post processing to correct for the errors, or in analog processing to compensate for the errors.

The present disclosure describes two techniques of measuring those bit weight errors in an SAR ADC using reservoir capacitors and decide-and-set switching. The first technique lends itself to what is referred to as a factory and/or foreground calibration where the application of externally applied inputs can be easily accommodated. The first technique can be accomplished in an environment where externally applied DC voltages can be provided so that each bit to be calibrated can be placed in optimum conditions for measuring the bit weight errors. The second technique also lends itself to a foreground calibration method but also lends itself to what is referred to as a self-calibration method which does not require the application of specific externally applied voltages to support the calibration and can be implemented completely "on-chip".

Both techniques involve controlling switches in an SAR ADC and recording the bit trial results to measure the error of each bit. Before diving into the techniques, the following passages describe the SAR ADC architecture as well as the switches that can be provided in an SAR ADC of the embodiments disclosed herein.

Figure 6:
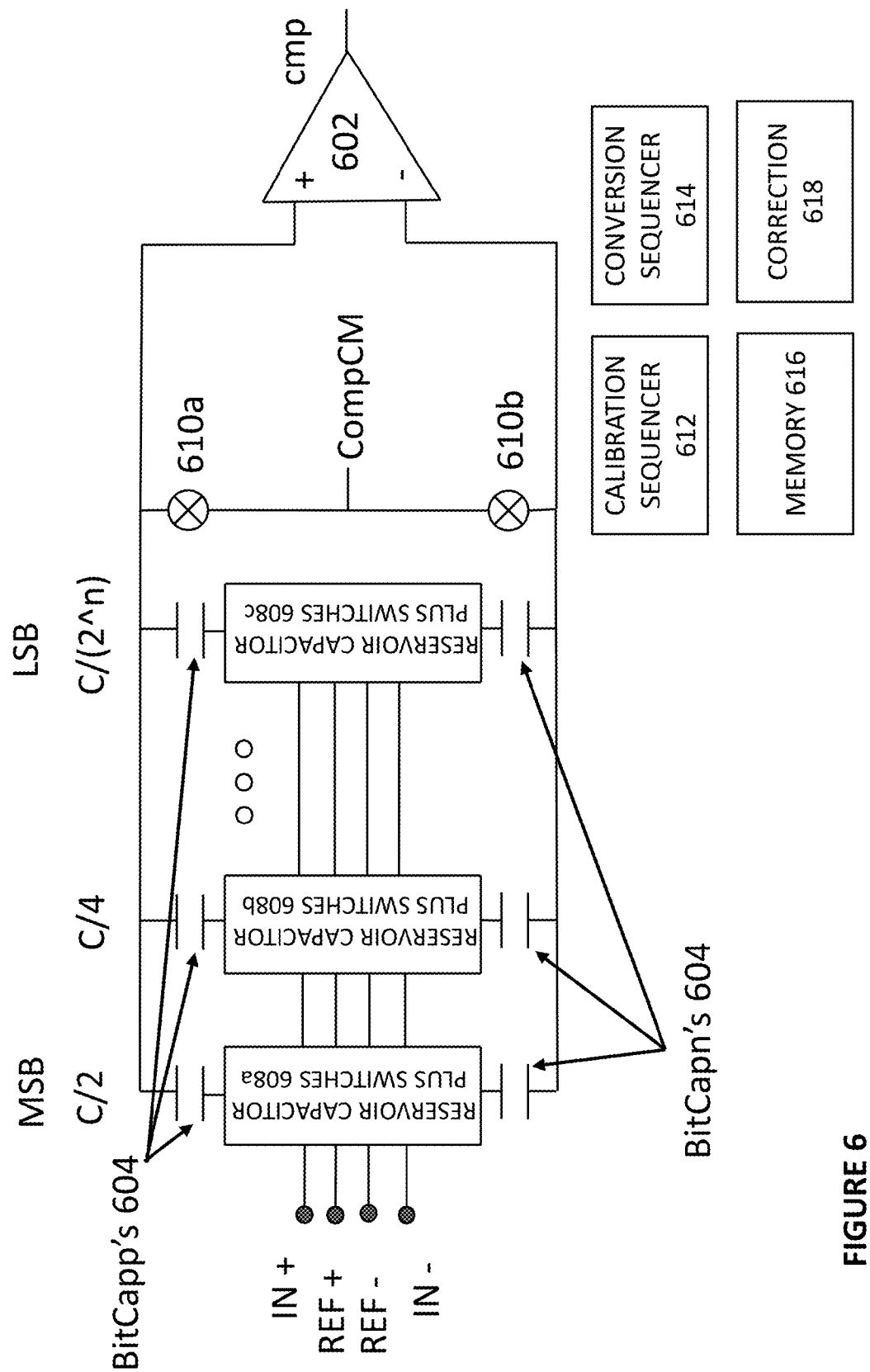
FIG. 6 shows a simplified system diagram of a SAR ADC having on-chip reservoir capacitors, according to some embodiments of the disclosure.

FIG. 6 shows a simplified system diagram of a SAR ADC having on-chip reservoir capacitors, according to some embodiments of the disclosure. In this high level view, an exemplary SAR ADC has (one) comparator 602 having output cmp, and circuitries for generating a number of bits in the capacitor DAC. It can be seen that each bit from MSB to LSB has corresponding bit caps, BitCapp's 604 and BitCapn's 606, as part of the circuitry for generating a bit. In this example, the bit caps are binarily weighted, e.g., having capacitance, $C/2, C/4, \ldots C/(2^n)$. Each circuitry for generating a bit further includes its own reservoir capacitor and a set of switches (shown as reservoir capacitor plus switches 608a-c). Each circuitry for generating a bit can be connected to several inputs, e.g., $V_{in}$ voltage input being sampled provided on terminals IN+ and IN−, and $V_{REF}$ reference voltage shown as terminals REF+ and REF−. All the circuitry for generating a bit (e.g., the bit caps) can be connected a predetermined voltage CompCM (e.g., comparator common mode voltage, a voltage preferred by comparator 602 at its inputs, such as $V_{REF}/2$) via sample switches 610a-b. Before conversion, top plate nodes of the bit caps are connected to CompCM. When conversion starts, sample switches 610a-b would open up to "take a sample", and charge is trapped at the top plates of the bit caps and has nowhere to go (since the charge cannot go through open sample switches 610a-b or high impedance input of the comparator 602). Once the charge is trapped, the circuitries shown can proceed with conversion.

The SAR ADC can include a calibration sequencer 612 and a conversion sequencer 614 (in some cases combined into one module). A memory element 616 can be provided to store one or more of the following: results of bit trials during calibration, measured error, calibration words, error coefficients derived from the measured error and/or calibration words, results of bit trials during conversion, output words generated by conversion, etc. A correction module 618 can be included to perform digital post processing to correct the measured error and/or compensation for the measured error in the analog domain. Generally speaking, all of the SAR circuitry (shown in the FIGURE), calibration sequencer 612, conversion sequencer 614, memory element 616, and correction module 618 are all provided on the same semiconductor substrate, or on the same chip. The calibration sequencer 612 and the conversion sequencer 614 can take the output cmp of comparator 602 as input and generate a plurality of output signals for controlling switches of the SAR ADC.

The calibration sequencer 612 may include digital logic or circuitry for controlling the switches in the SAR ADC to implement the calibration techniques, storing results of bit trials, and performing digital post processing of the results from the bit trials of the calibration technique to determine the error for each bit. To control the switches, calibration sequencer 612 may generate control signals with suitable timing to open and close certain switches in the SAR ADC. In some embodiments, the calibration sequencer 612 can be configurable to perform different techniques for calibration, and/or cooperate with correction module 618 to perform techniques for calibration of the SAR ADC.

The conversion sequencer 614 can include digital logic or circuitry for controlling the switches in the SAR ADC to implement a normal conversion process, and for performing any digital post processing for producing a conversion result from the bit trials of the conversion process. For instance, the conversion sequencer can take the output of the comparator cmp as input to generate the proper control signals to open or close the proper switches to implement the conversion process. To control the switches, conversion sequencer 614 may generate control signals with suitable timing to open and close certain switches in the SAR ADC.

Figure 7:
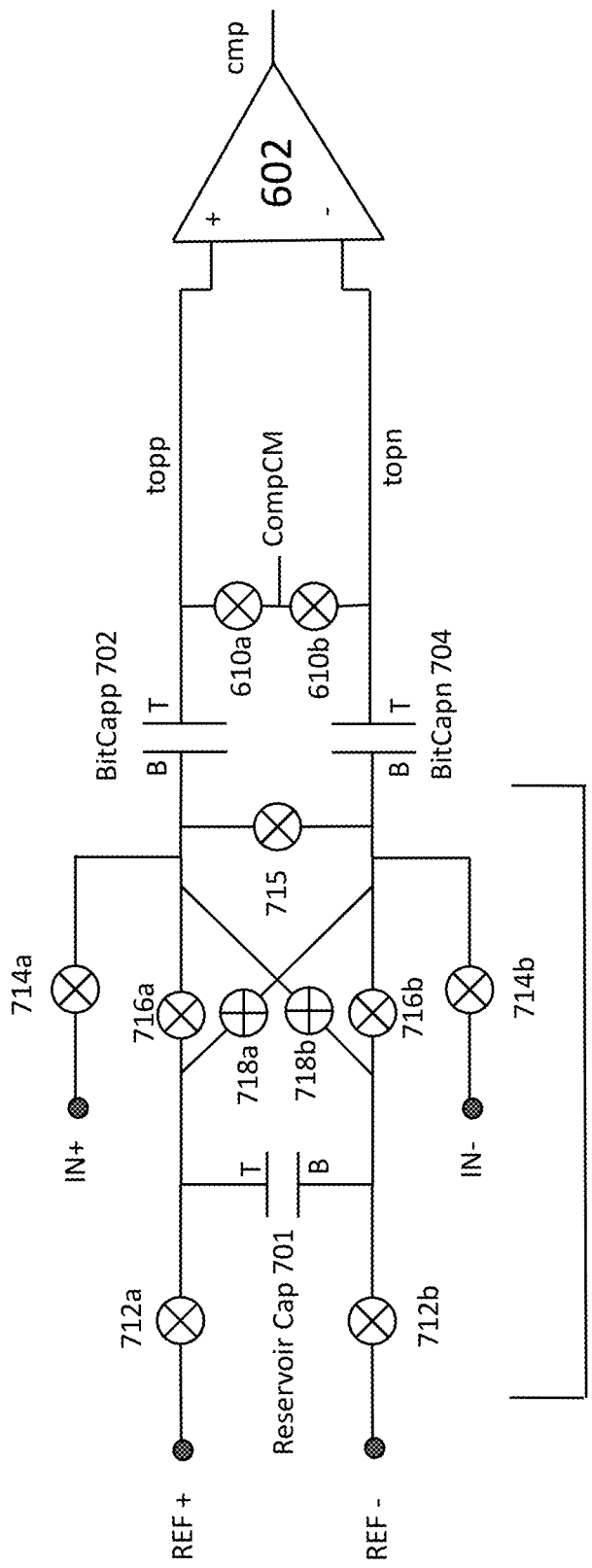
FIG. 7 shows a circuitry for generating a bit of the SAR ADC, according to some embodiments of the disclosure.

FIG. 7 shows a circuitry for generating a bit of the SAR ADC, according to some embodiments of the disclosure. The circuitry includes bit caps for the bit, BitCapp 702 and 704, and a reservoir capacitor 701. Their top and bottom plates are marked by the letters "T" and "B" respectively. BitCapp 702 and 704 each have a top plate node, shown as topp and topn respectively. Sample switches 610a-b can connect the top plates to CompCM if the sample switches 610a-b are closed. In the reservoir capacitor plus switches section, there are two precharge switches 712a and 712b, and a set of bottom plate switches for the BitCapp 702 and 704. The precharge switches 712a-b can connect the reservoir cap 701 top and bottom plates to REF+ and REF− respectively. There are four bottom plate switches for each of the bottom plates of BitCapp 702 and 704. The bottom plate switches includes input switches 714a-b, which can be used to connect IN+ and IN− (respectively) to the bottom plates of BitCapp 702 and 704 (respectively). The bottom plate switches further includes a shorting switch 715, which can be used to short the bottom plates of BitCapp 702 and 704. The bottom plate switches further has bit switches that can connect the reservoir capacitor 701 "right-side up" or "upside down" to the bottom plates of BitCapp 702 and 704. The bit switches include right-side up switches 716a-b for connecting the top plate of reservoir cap 701 to the bottom plate of BitCapp 702 and the bottom plate of reservoir cap 701 to the bottom plate of BitCapn 704, and upside down switches 718a-b for connecting the top plate of reservoir cap 710 to the bottom plate of BitCapn 704 and the bottom plate of reservoir cap 701 to the bottom plate of BitCapp 702. Depending on whether the right-side up switches 716a-b or the upside down switches 718a-b are used, the polarity of the reservoir cap 710, and thus effectively REF+ and REF− changes. If the shorting switch 715 and either the right-side up switches 716a-b and/or the upside down switches 718a-b are closed, the reservoir capacitor 701 can be discharged.

In an SAR ADC with on-chip reservoir caps, it is almost guaranteed to have an error even if the bit caps are perfectly weighted because the charge is drawn from a limited charge available from the reservoir caps for each bit. Broadly speaking, the switches for the circuitry are controlled to measure the error of the different bits by exposing the effective weight of the bits, one by one. In some embodiments, the error measurement technique (as implemented by the calibration sequencer 612 of FIG. 6) can begin with the MSB, and measure the MSB with respect to all the bits under it (all the lower bits, e.g., MSB-1, MSB-2, . . . . LSB). Then, the technique can proceed to measure the MSB-1 with respect to all the bits under it (e.g., MSB-2, MSB-3, . . . LSB). The error measurement technique can continue down to the LSB, or until the bits are so small the error is not worth correcting.

Figure 8:
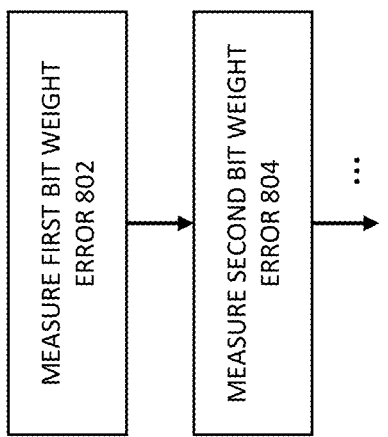
FIG. 8 shows a flow diagram illustrating a method for measuring bit weight errors of a SAR ADC, according to some embodiments of the disclosure.

FIG. 8 shows a flow diagram illustrating a method for measuring bit weight errors of a SAR ADC, according to some embodiments of the disclosure. The method for measuring bit weight errors of a successive-approximation register analog-to-digital converter (SAR ADC) is outlined in the figure. As mentioned above, the SAR ADC uses decide-and-set switching and has on-chip reservoir capacitors being used in individual bit decisions. The method begins by measuring a first bit weight error associated with first bit capacitors and a first on-chip reservoir capacitor of first circuitry for generating a first bit of the SAR ADC (box 802). Once the first bit weight error is measured, the method proceeds by measuring a second bit weight error associated with second bit capacitors and a second on-chip reservoir capacitor of second circuitry used for generating a second bit of the SAR ADC (box 804). The second bit can be the next lower bit of the first bit. For instance, the method can begin with the MSB as the first bit, then MSB-1 as the second bit. The method can proceed to measure the bit weight errors of the lower bits, e.g., MSB-2, MSB-3, . . . LSB. Following an appropriate switching sequence, the technique can (independently) expose a first effective weight of the first bit of the SAR ADC and expose a second effective weight of the second bit of the SAR ADC (and so on). Using the techniques described herein, the bit weight errors measured are independent of each other (e.g., the second bit weight error is independent from the first bit weight error). Thus, the technique advantageously orthogonalizes the error contribution of the bits, meaning only one calibration word per bit of the SAR ADC is to be generated and stored.

A First Exemplary Technique Using a Plurality of Predetermined Inputs

To measure the magnitude of the errors associated with each bit independently, the system is setup to properly expose all of the contributing error sources during the time the error is measured. At a high level, the first exemplary technique exposes the effective weights of the bits by forcing the SAR ADC to sample a series of predetermined inputs. For a bit under test, the technique can apply a specific differential input voltage to be sampled by the SAR ADC. Then the lower bits can be used as weights to weigh the bit under test or to balance the effective weight of the bit under test.

The SAR ADC involves a charge balancing process. Thus, to expose the effective weight of a bit under test, a specific input voltage (e.g., in the form of a differential signal to differential inputs IN+ and IN−, herein also referred to as "predetermined input" or "predetermined input voltage") is provided to produce a charge that would be cancelled by the charge delivered by zero or more bits that are more significant than the bit under test (or bits which are no longer being tested, or bits that are not of interest when measuring the effective weight of the bit under test). The specific differential input voltage effectively forces the inputs to the comparator to be at zero differential for the bits that are more significant than the bit under test during the conversion process so that the more significant to the bit under test do not contribute or make a contribution to the effective weight of the bit under test being measured. Phrased differently, the specific input voltage exposes the effective weight of the bit under test by making the bits that are more significant than the bit under test cancel out the charge delivered by the specific input voltage and isolates the effective weight of the bit under test.

For a differential SAR ADC, the first predetermined input comprises a first differential input signal and/or the second predetermined input comprises a second differential input signal. The following outlines an example where the SAR ADC samples a differential input signal having a differential pair of input voltages. For exposing the weight of the MSB, because there are no more significant bits above the MSB, the specific input voltage can be differential zero or be a differentially zero input (i.e., the two voltages of the differential pair is the same). For exposing the weight of the MSB-1, MSB is more significant than MSB-1, and thus, the specific input voltage can have a differential voltage that corresponds to the weight of the MSB (i.e., the difference between the two voltages of the differential pair matches up with the weight of the MSB). For exposing the weight of the MSB-1, MSB and MSB-1 are more significant than MSB-2, and thus, the specific input voltage can have a differential voltage that corresponds to the sume of the bit weights of the MSB and MSB-1. To generalize, the difference between the differential signal pair for the specific input voltage corresponds to weight(s) of the bit(s) which are more significant to the bit under test so that the charge delivered by the differential signal pair can be cancelled out by the weight(s) of the bit(s) which are more significant to the bit under test.

In one example, the series of predetermined inputs being provided at IN+ and IN− (as differential inputs) for measuring the error of each bit can start at midscale (half fullscale (FS)), e.g., a pair of signals [½ FS, ½ FS], then [¼ FS, ¾ FS], [⅛ FS, ⅞ FS], [1/16 FS, 15/16 FS] . . . . Here the common mode voltage is at half FS, but it is not necessary for the common mode voltage of any of these pairs of signals to be at half FS. Other suitable common mode voltages are possible. The inputs would generally expose the weight of the bit under test to effectively isolate the bit under test. The predetermined input signals can be generated using a precise signal generator that can provide the plurality of voltages.

Accordingly, measuring a first bit weight error associated with the first bit capacitors and the first on-chip reservoir comprises sampling a first predetermined input using first circuitry for generating a first bit, and measuring a second bit weight error associated with the second bit capacitors and the second on-chip reservoir comprises sampling a second predetermined input using a second circuitry for generating a second bit, wherein the second predetermined input is different from the first predetermined input. This can repeat using further different predetermined inputs for the other bits.

Figure 9:
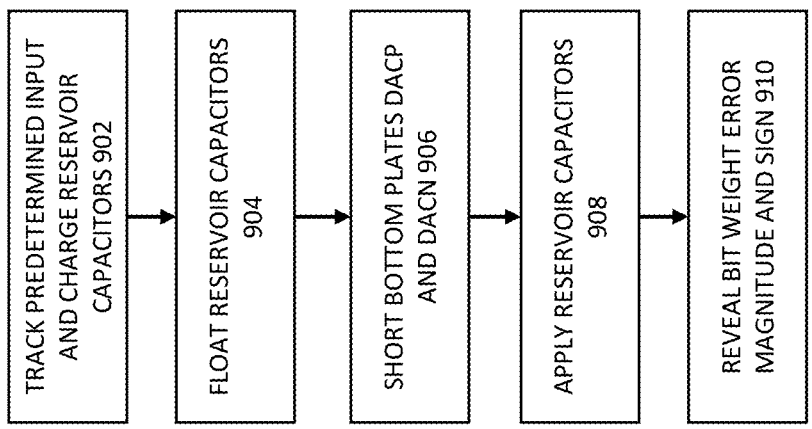
FIG. 9 shows a flow diagram illustrating a detailed method for measuring bit weight errors of a SAR ADC, according to some embodiments of the disclosure.

Furthermore, the technique enforces a switching sequence that emulates the switching sequence during a normal conversion process. FIG. 9 shows a flow diagram illustrating a detailed method for measuring bit weight errors of a SAR ADC, according to some embodiments of the disclosure. This means that when measuring the error associated with a particular bit under test, the technique applies a predetermined input voltage to the bottom plates of the bit caps which tracks the input, and at the same time, charges reservoir capacitors (box 902). The technique then floats the reservoir capacitors (box 904), and shorts the bottom plates of BitCapp's and BitCapn's (box 906).

The reservoir caps are applied into the system with the bit under test reservoir capacitor inserted right-side up and all remaining reservoir caps applied up-side down (box 908). A measure of the difference between the top plate voltages topp and topn reveals the sign and magnitude that the bit under tests contribution to that error (box 910). After that measurement is taken the process is repeated again but this time with all of the reservoir capacitors reversed (box 908). A measure of the difference between the top plate voltages reveals the sign and magnitude of all the other bits that contribute to the error (box 910). Superposition applies in this SAR ADC therefore the difference of the two measurements reflects the total error and sign of that error for the bit under test. All bits to be calibrated can be measured in this manner. In some embodiments, it is possible to utilize the conversion process in a closed loop manner to expose the effective weight of the bit under test by appropriately setting all the lower bits to complement the more significant bit. In such embodiments, the lower bits can "weight" the more significant bit.

To show further detail on the first exemplary technique and switching sequence thereof, FIGS. 10-23 illustrate a series of switching steps for measuring bit weight errors of an SAR ADC, according to some embodiments of the disclosure. For illustration, the figures show the state of switches for the MSB and the next lower bit MSB-1. It is envisioned that there can be more circuitry for other lower MSBs. Similar to FIG. 7, these figures show comparator 602 and sample switches 610*a-b*. The figures further shows bit caps, MSB Bitcapp 1040, MSB Bitcapn 1050, MSB-1 BitCapp 1060, and MSB-1 BitCapn 1070, and respective circuitries for generating a bit using those bit caps. The MSB circuitry has MSB reservoir cap 1080, and the MSB-1 circuitry has MSB-1 reservoir cap 1090. The circuitry for the MSB include precharge switches 1002*a-b*, input switches 1006*a-b*, right-side up switches 1010*a-b*, upside down switches 1012*a-b*, and shorting switch 1020. The circuitry for the MSB-1 include precharge switches 1004*a-b*, input switches 1008*a-b*, right-side up switches 1014*a-b*, upside down switches 1016*a-b*, and shorting switch 1030.

The switching sequence for measuring the bit weight error of one bit can have two phases, where a first phase inserts the reservoir cap of the bit under test one way, and second phase after the first phase inserts the reservoir cap of the bit under test the other way. FIGS. 10-16 illustrate the first phase, and FIGS. 17-23 illustrate the second phase.

Figure 10:
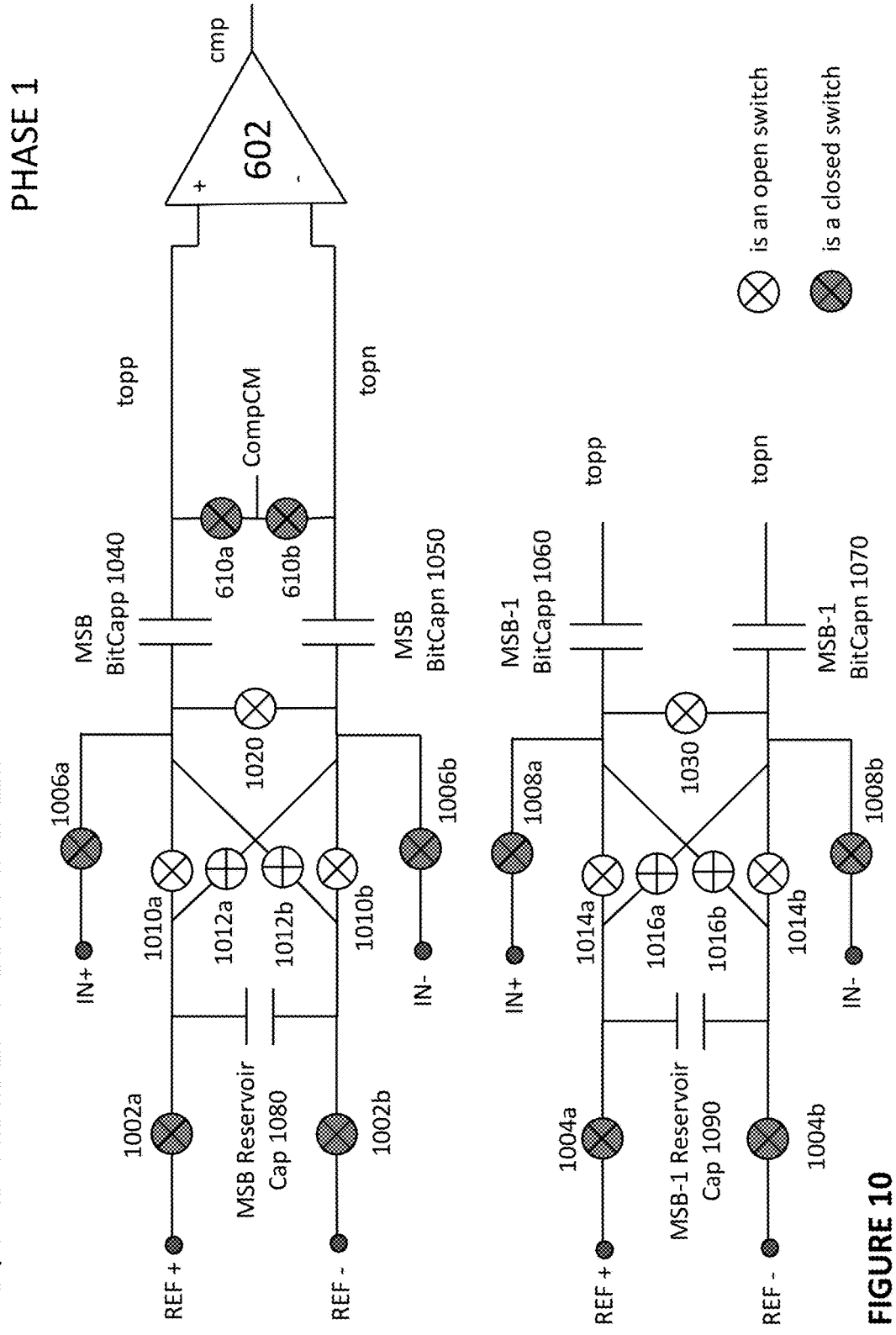
FIGS. 10-23 illustrate a series of switching steps for measuring bit weight errors of a successive-approximation register analog-to-digital converter (SAR ADC), according to some embodiments of the disclosure.

Referring to FIG. 10, the SAR ADC goes into an "acquisition and reservoir capacitor refresh" stage. In this stage, the reservoir capacitors (i.e., MSB reservoir cap 1080, MSB-1 reservoir cap 1090, etc.) are charged by means of closing precharge switches 1002*a-b* and 1004*a-b* (and other corresponding switches in the lower bits). At the same time period, the bit caps are tracking the input by means of closing sample switches 610*a-b* and input switches 1006*a-b* and 1008*a-b*. The state of these switches are the same for other lower bits.

Figure 11:
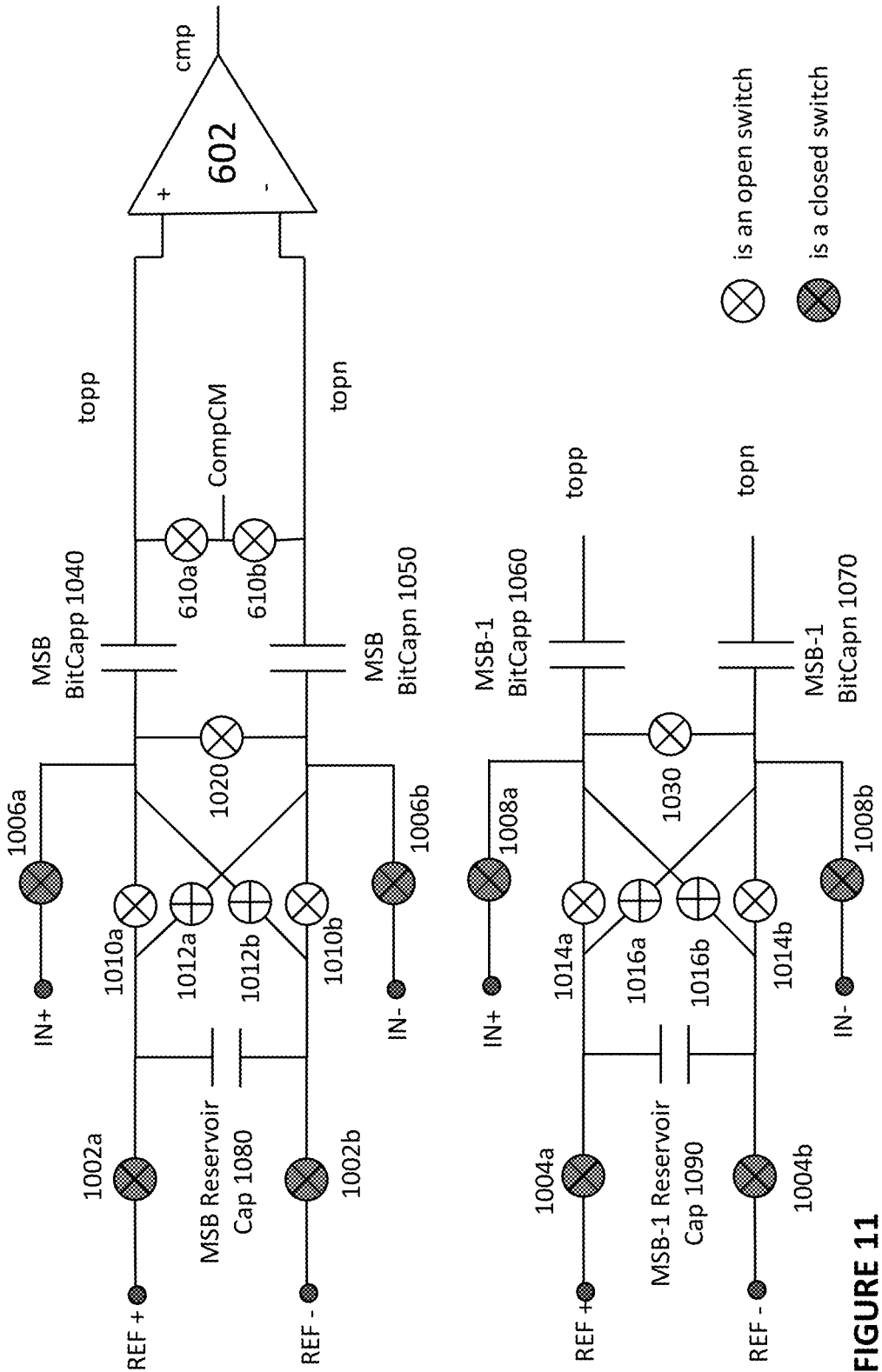

Referring to FIG. 11, the SAR ADC goes into "take the sample" stage. In this stage, the input voltage is sampled onto the bit caps, MSB BitCapp 1040, MSB BitCapp 1050, MSB-1 BitCapp 1060, MSB-1 BitCapn 1070, and so forth, by means of opening sample switches 610*a-b*.

Figure 12:
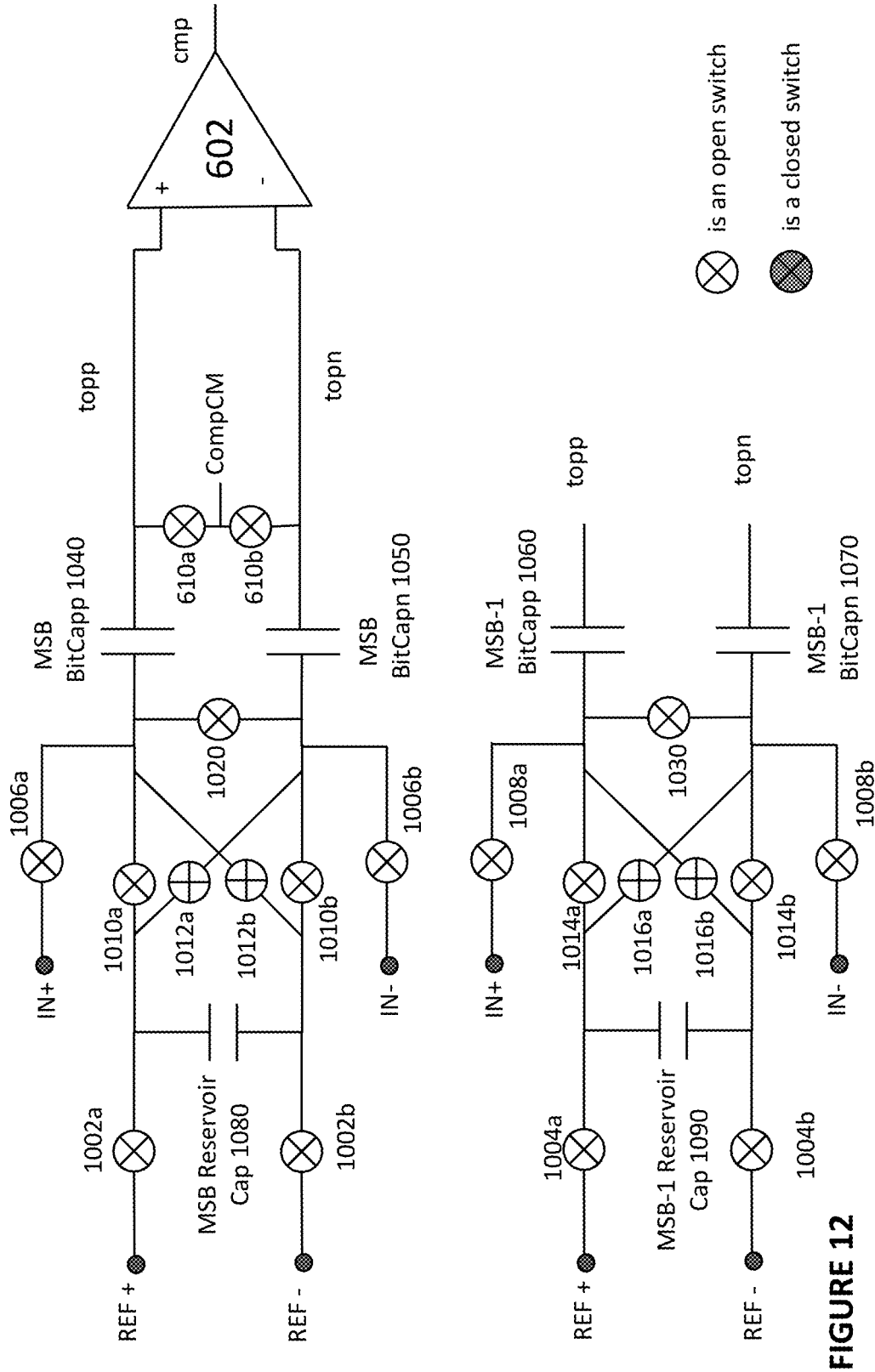

Referring to FIG. 12, the SAR ADC goes into "disconnect from the outside world" stage. In this stage, the reservoir caps, MSB BitCapp 1040, MSB BitCapp 1050, MSB-1 BitCapp 1060, MSB-1 BitCapn 1070, and so forth, are no longer connected to the (outside) reference REF+ and REF−, by means of opening the precharge switches 1002*a-b* and 1004*a-b* (and so on). The charge is trapped in the on-chip reservoir capacitors, and are said to be "floating", or the step is construed as "floating the reservoir capacitors".

Figure 13:
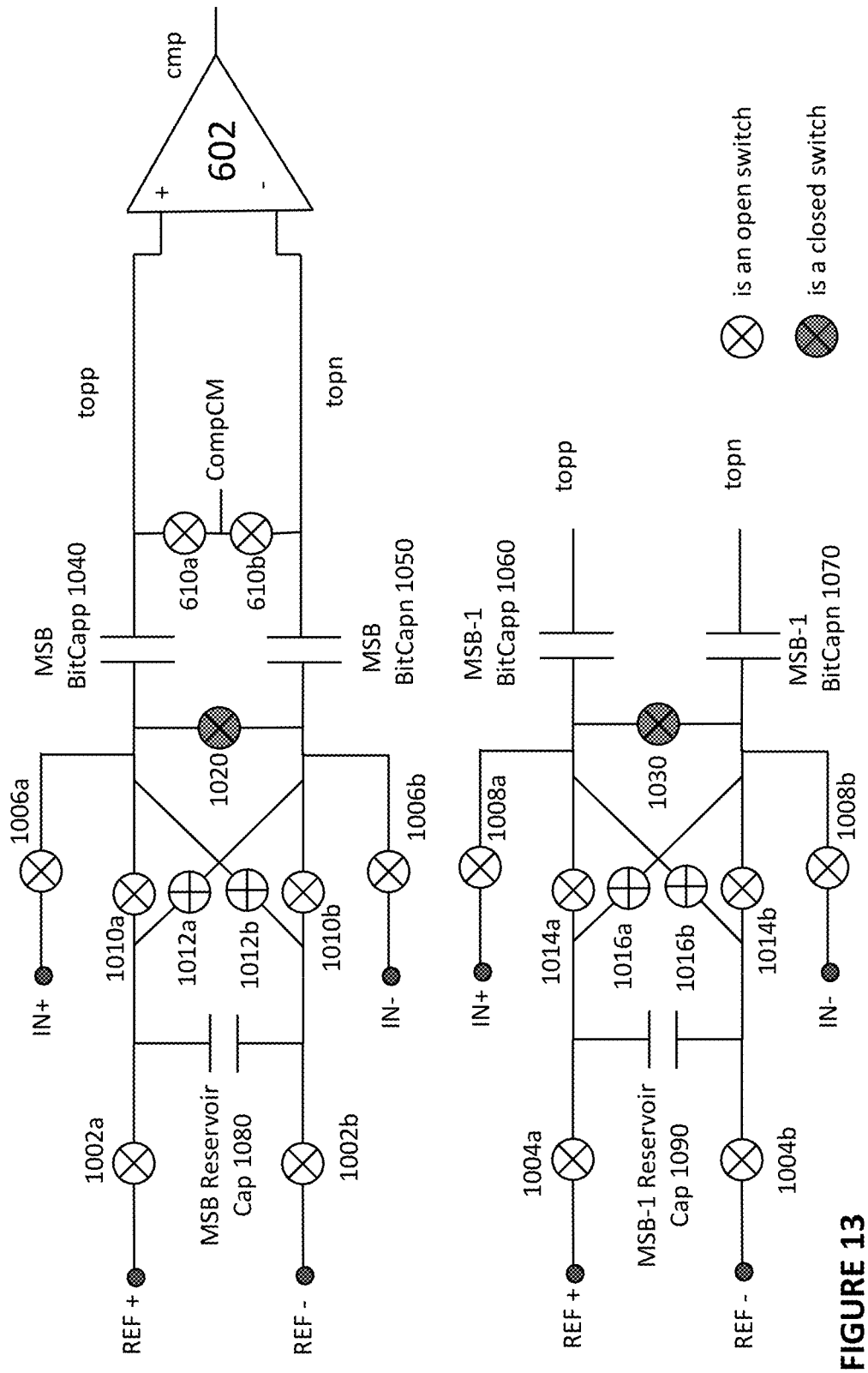

Referring to FIG. 13, the SAR ADC goes into "close shorting switches" stage. In this stage, the shorting switches 1020, 1030 (and so forth for the other shorting switches for the lower bits) are closed to transfer the sampled input voltage from the bottom plates of the bit caps to the top plate nodes (top and topn). After the shorting switches are closed, voltages of topp and topn move up and down.

Figure 14:
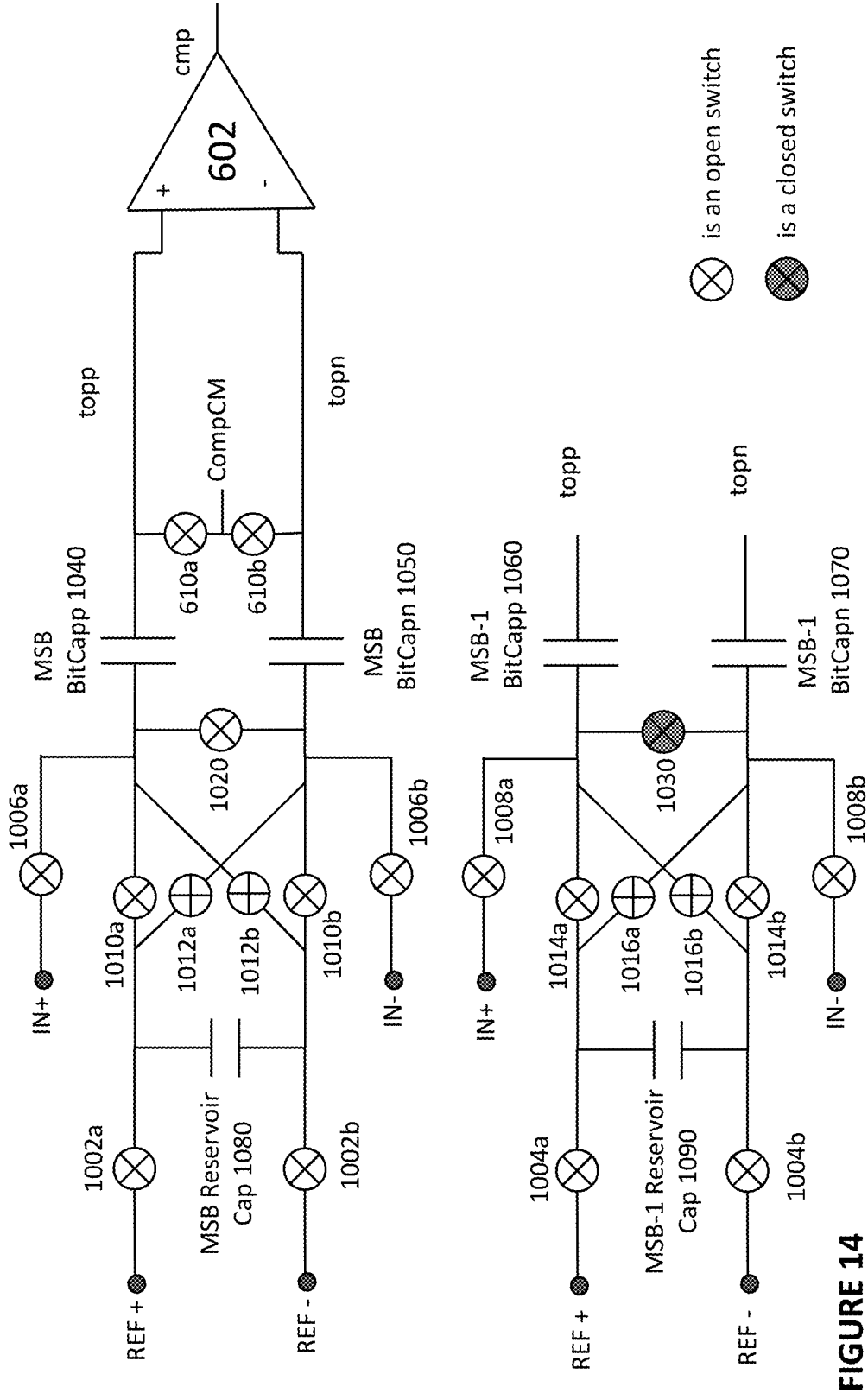

Referring to FIG. 14, the SAR ADC goes into "open the MSB shorting switch" stage. In this stage, the shorting switch of the bit under test is opened. Note that in a normal conversion process, when voltages of topp and topn moved when shorting switches closed, the output cmp of comparator 602 is used by a calibration sequencer to decide whether to insert the MSB reservoir cap 1080 right-side up or upside down. Before the MSB reservoir cap 1080 can be inserted, the shorting switch has to be opened first (otherwise the right-side up switches or the up-side down switches being closed when the shorting switch is closed discharges the reservoir cap).

Figure 15:
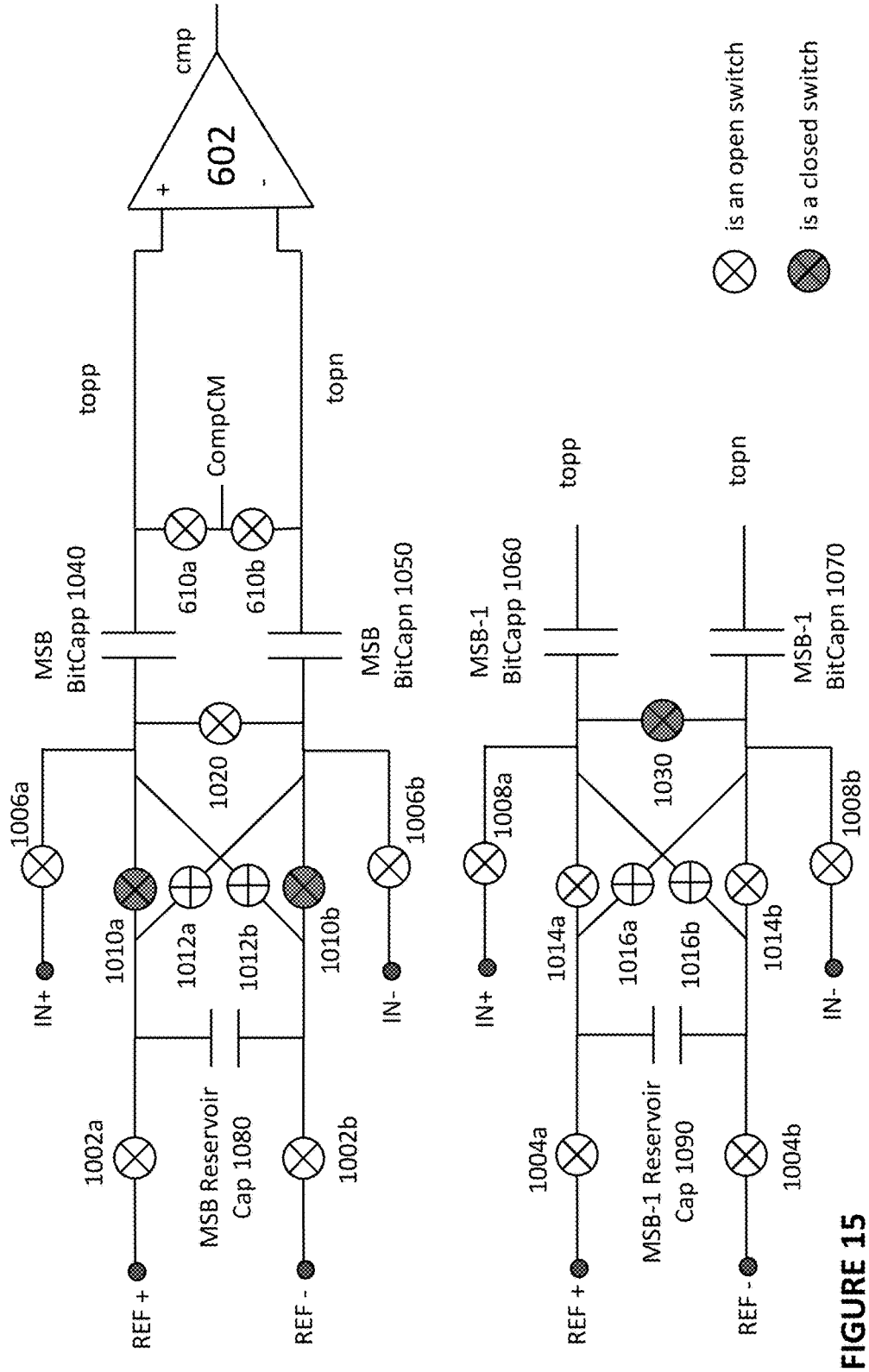

Referring to FIG. 15, the SAR ADC goes into "insert in the reservoir cap for bit under test" stage. For calibration, the output of the comparator and the conversion sequencer are ignored. The calibration sequencer inserts the MSB reservoir cap (or reservoir cap of the bit under test) one way, in this example, right-side up (although it can be inserted upside down instead).

Note that when a sample is taken, the top plate nodes top and topn move proportional to the input signal. During the conversion process, the sequencer tries to step by step to drive the top plate nodes back to CompCM. The resulting bit pattern (e.g., the output digital word) is a record of each bit trial driving the top plate nodes top and topn to converge. Depending on the comparator output cmp, the orientation of reservoir cap changes to move the top plates towards CompCM in response to the decision at the comparator output cmp.

Figure 16:
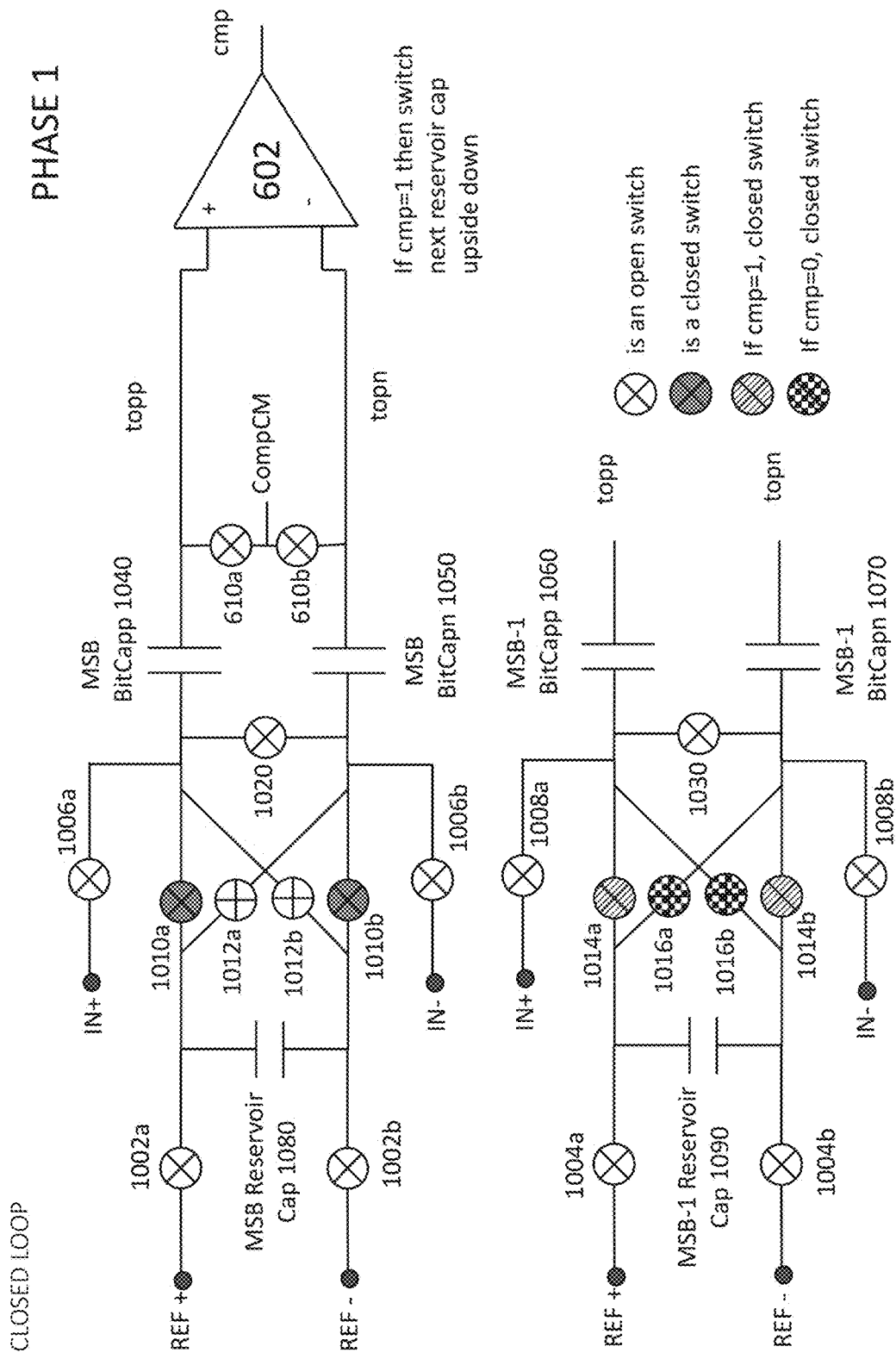

Referring back to FIG. 15, the calibration process inserts the reservoir cap right side up irrespective of the comparator decision (or upside down if desired). Referring now to FIG. 16, when moving onto the "closed loop" stage, the bit switches of the MSB (or the bit under test) remains closed, and bit switches for the lower bits are selectively closed based on the output of the comparator, one bit at a time. For instance, if cmp=1, the next reservoir cap (e.g., MSB-1 reservoir cap 1090) is inserted right-side up (by means of right-side up switches 1014*a-b*), and if cmp=0, the next reservoir cap (e.g., MSB-1 reservoir cap 1090) is inserted up-side down (by means of up-side down switches 1016*a-b*). Effectively, the comparator 602 and the calibration sequencer is attempting to balance out the weights of the lower bits with the weight of the MSB, where one at a time, the comparator 602 and the calibration sequencer opens up the shorting switch of the next bit and closes the bit switches to insert the reservoir cap of the next bit according to the comparator decision.

Figure 17:
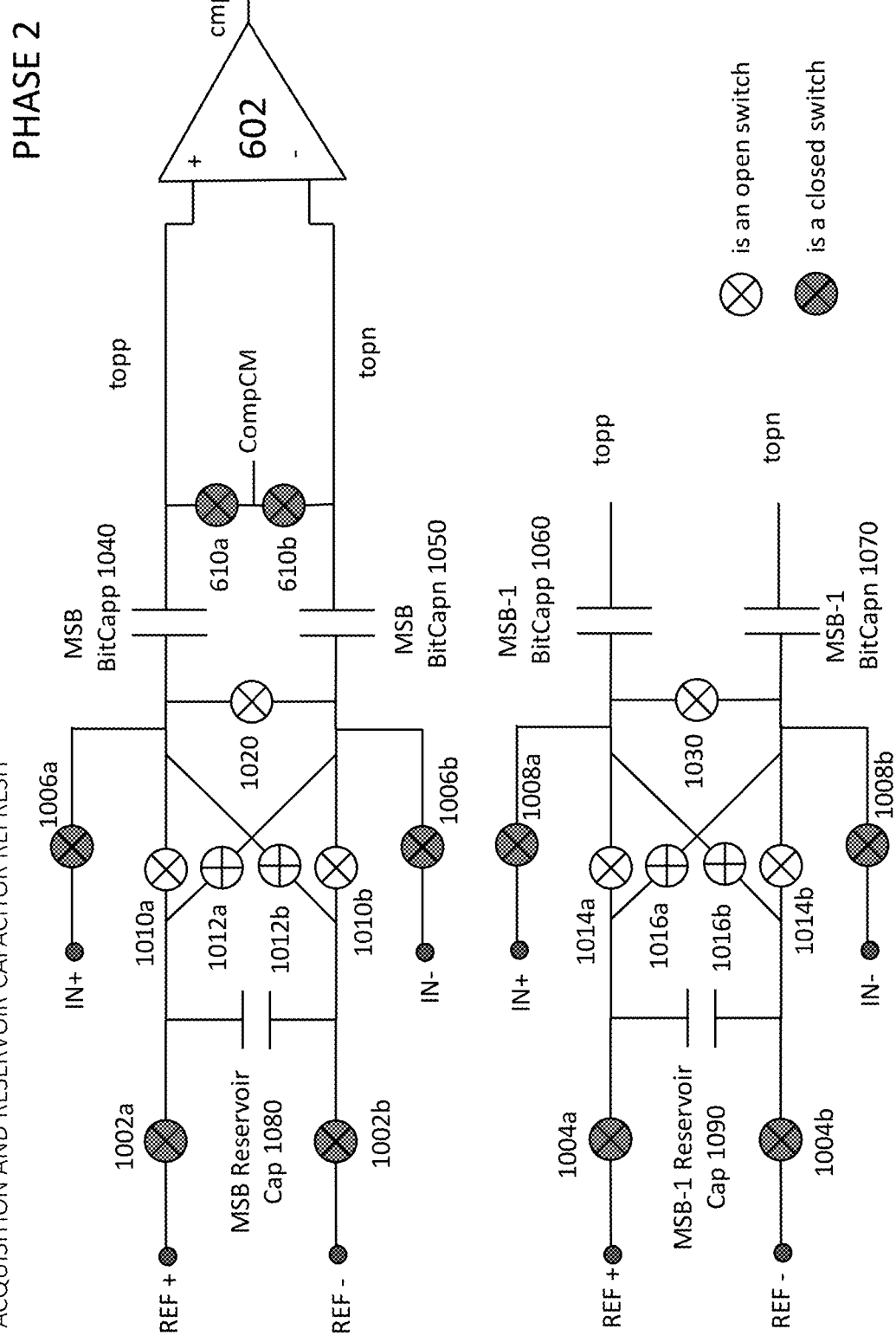
Figure 18:
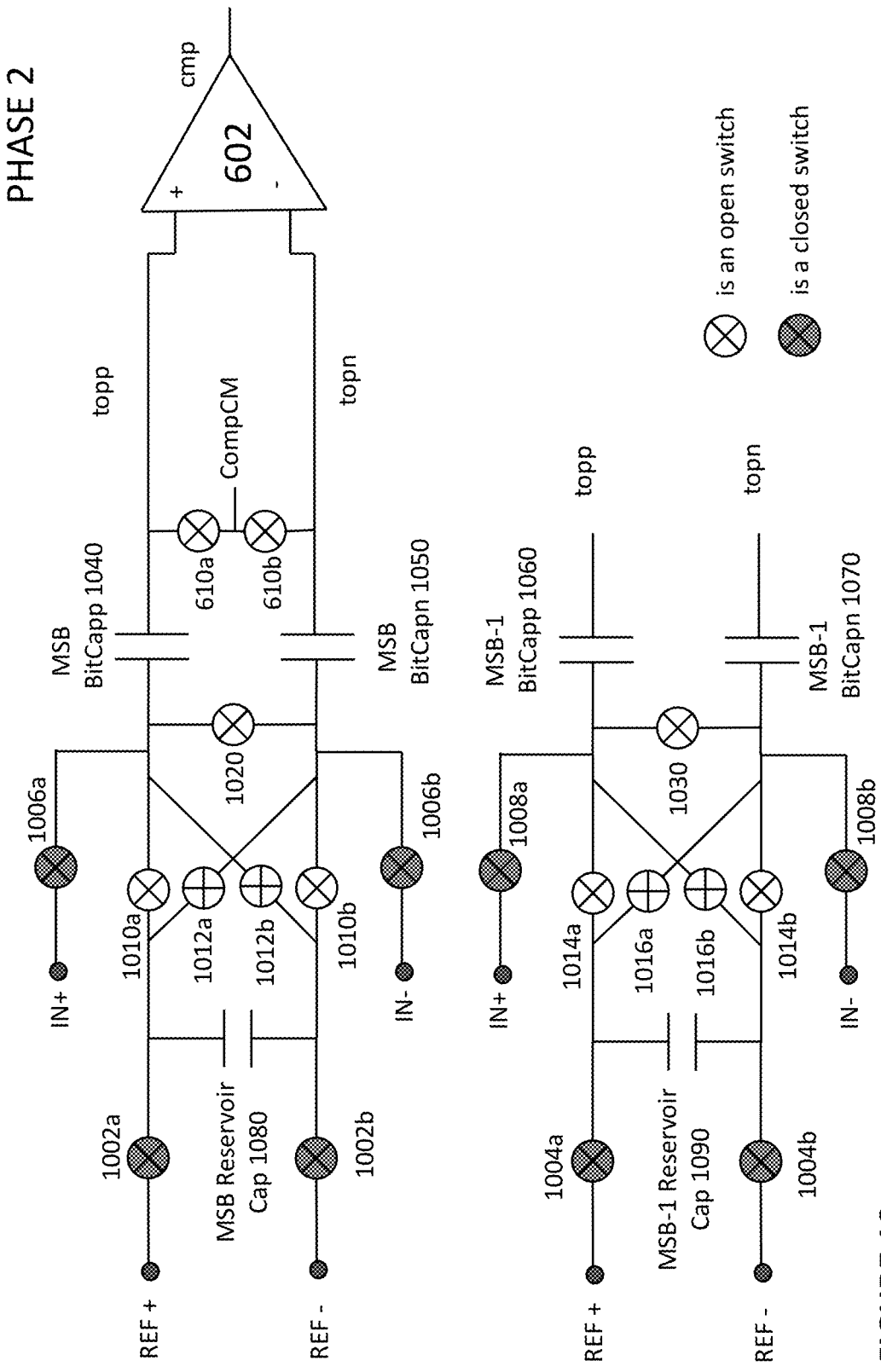
Figure 19:
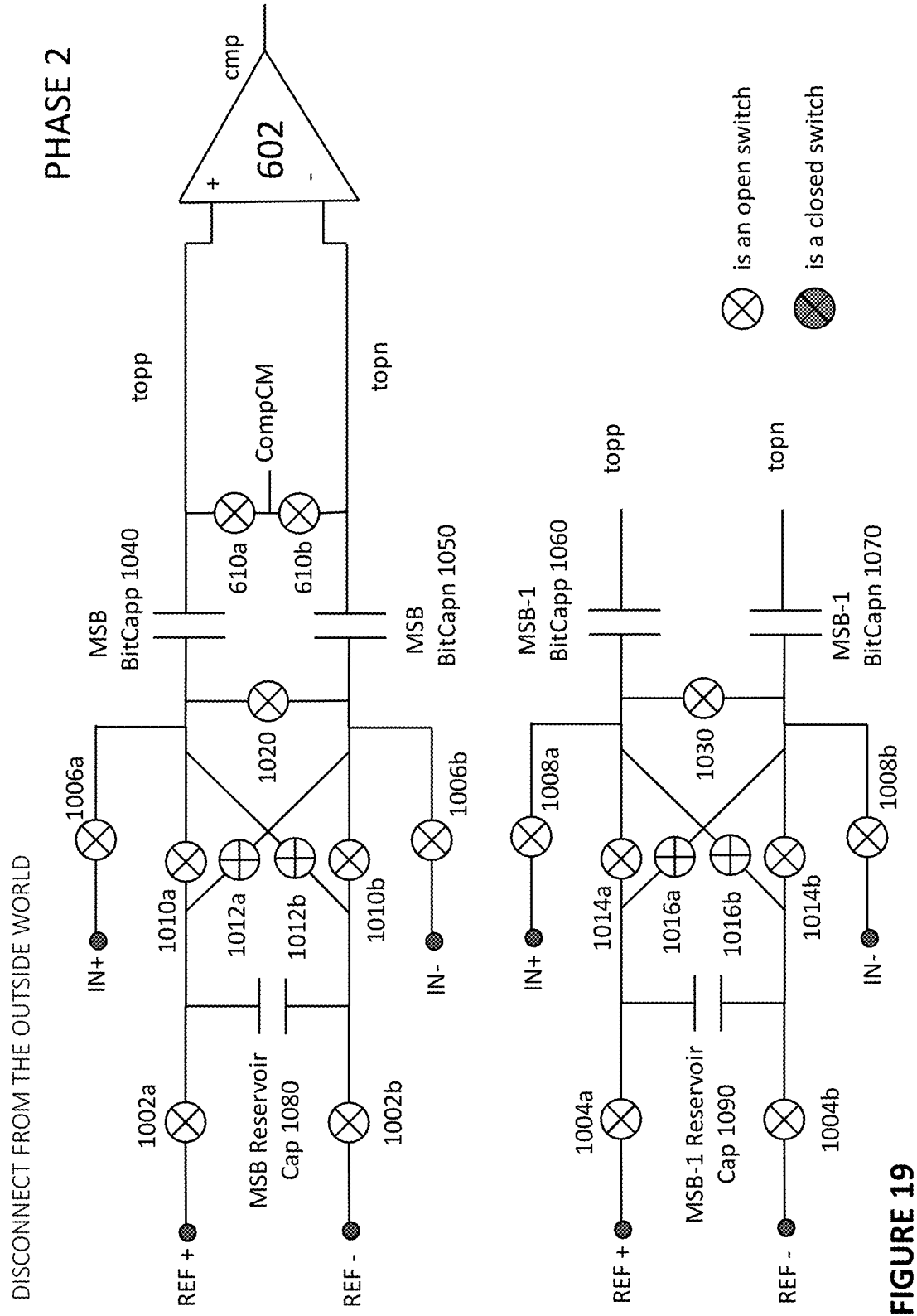
Figure 20:
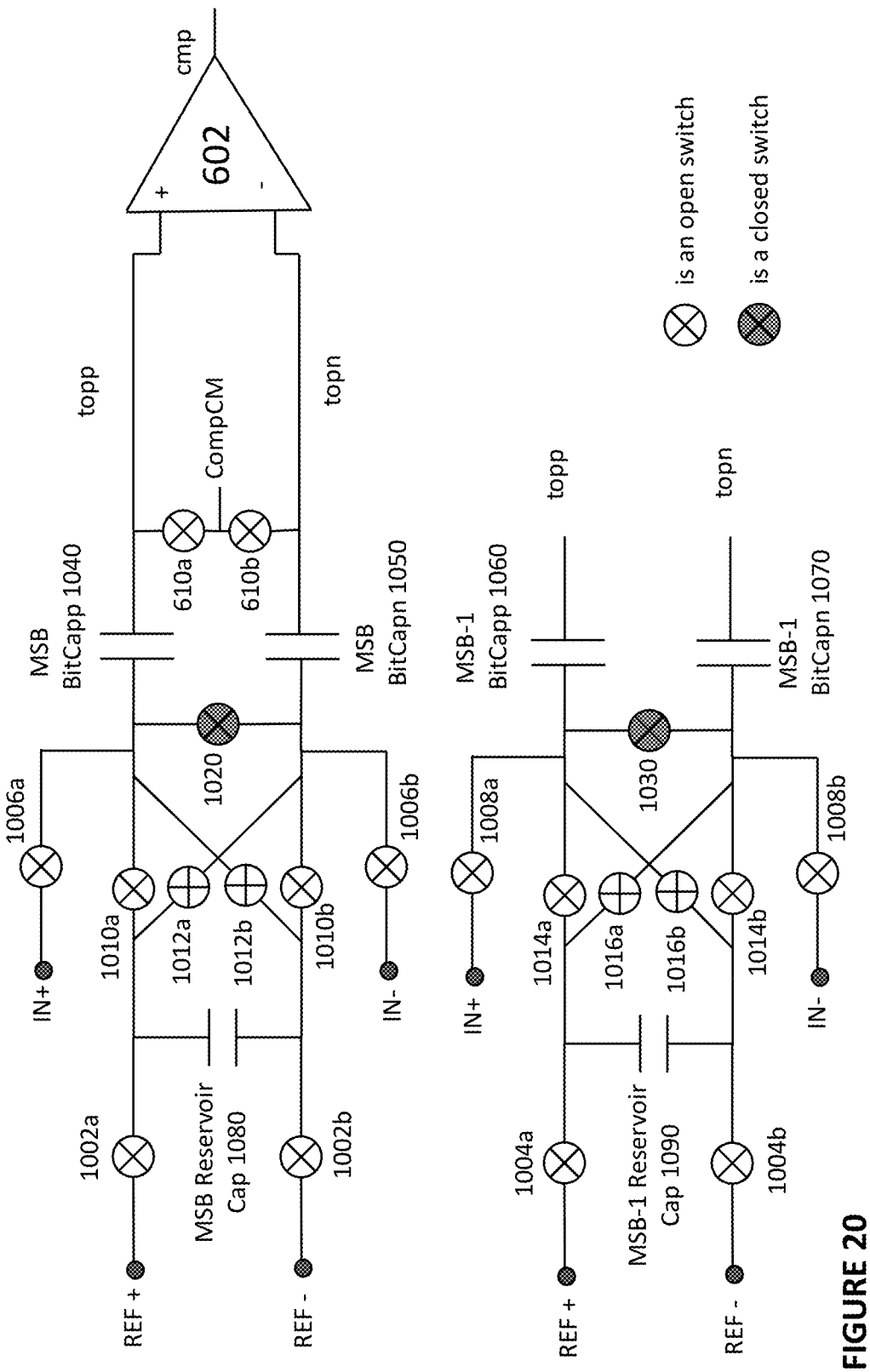
Figure 21:
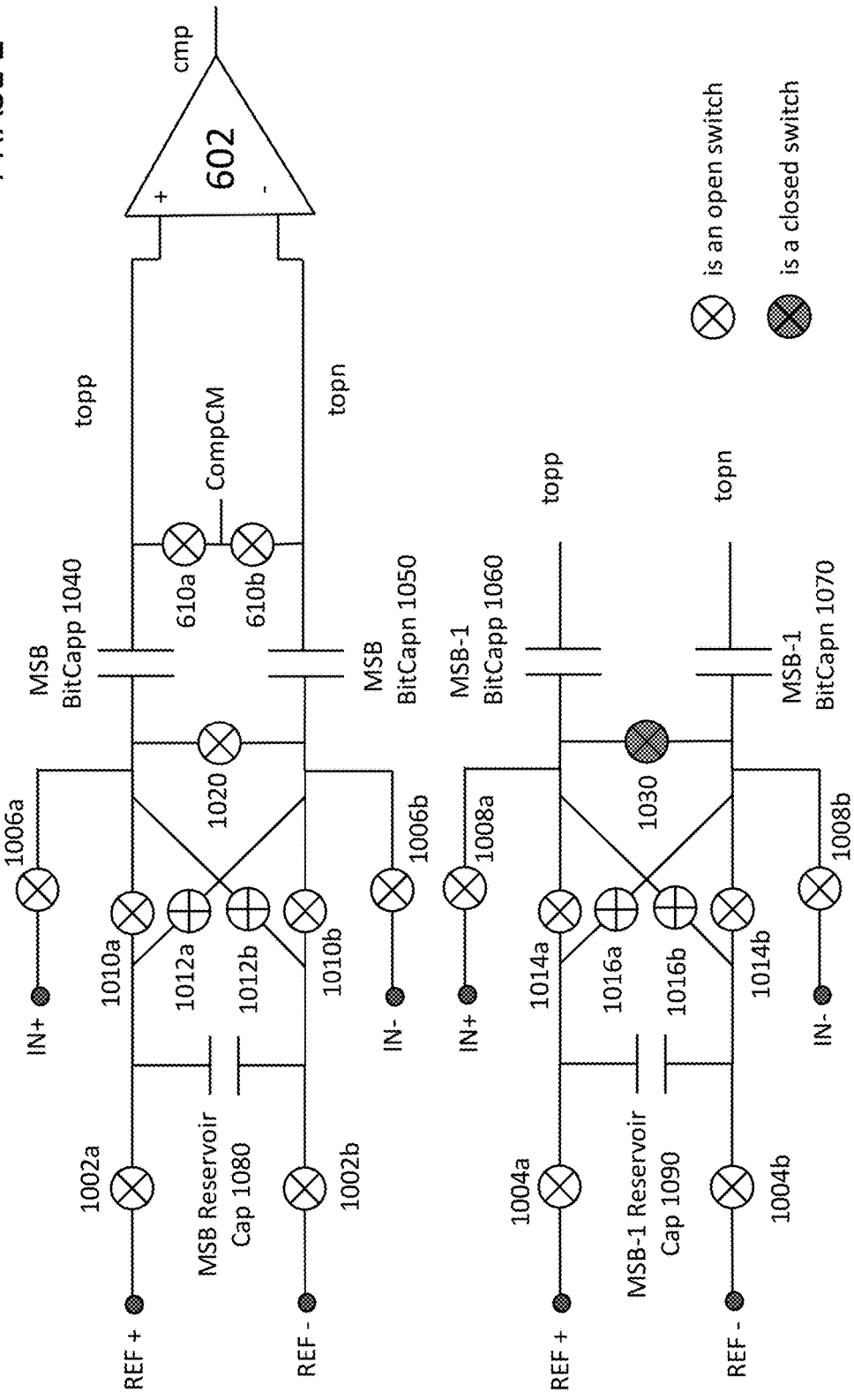

After the first phase is complete, the second phase takes the switching sequence back to the "acquisition and reservoir capacitor refresh" stage, as seen in FIG. 17. The switching in FIG. 17 is the same as FIG. 10. Then the switching sequence proceeds to the "take the sample" stage, as seen in FIG. 18. The switching in FIG. 18 is the same as FIG. 11. Then the switching sequence proceeds to the "disconnect from the outside world" stage, as seen in FIG. 19. The switching in FIG. 19 is the same as FIG. 12. Then the switching sequence proceeds to the "close shorting switches" stage, as seen in FIG. 20. The switching in FIG. 20 is the same as FIG. 13. Then the switching sequence proceeds to the "open the MSB shorting switch" stage (but leave low bits shorted), as seen in FIG. 21. The switching in FIG. 21 is the same as FIG. 14.

Figure 22:
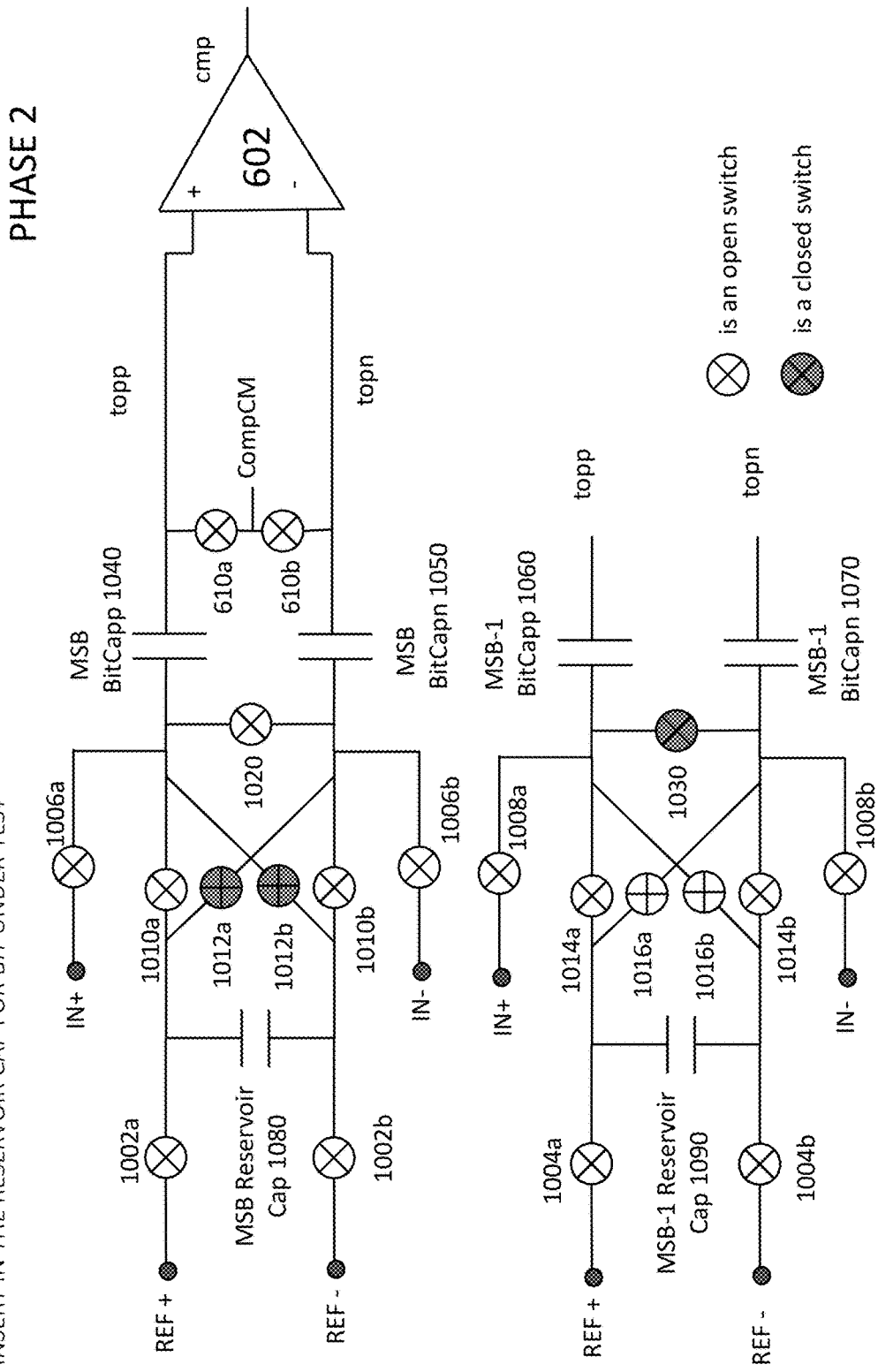

The second phase now performs switching at the "insert in the reservoir cap for bit under test" stage differently from the first phase, as seen in FIG. 22. In this stage, the reservoir cap of the MSB (or the bit under test) is inserted a different way (e.g., in this case upside down), again ignoring the comparator output cmp.

Figure 23:
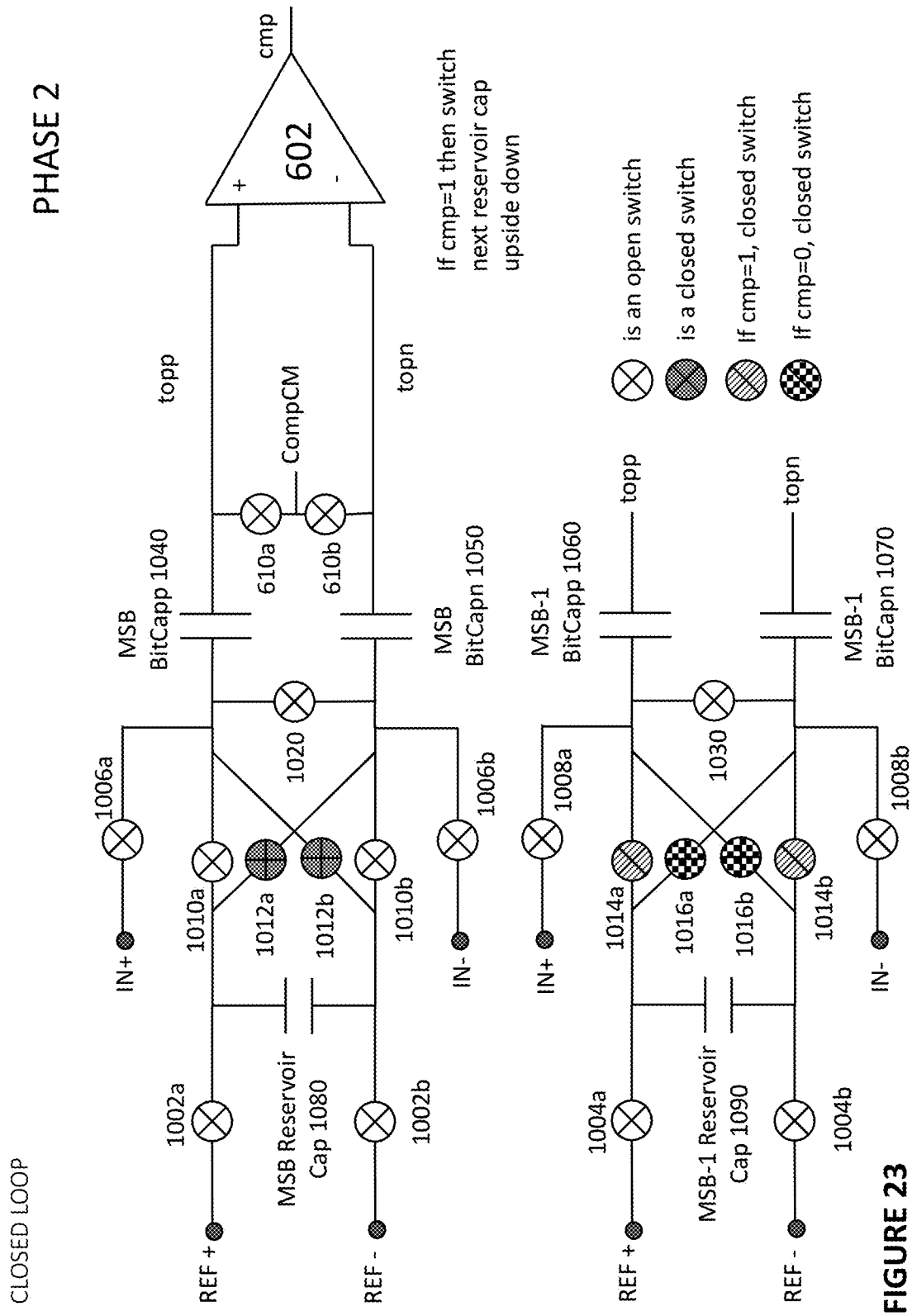

Referring now to FIG. 23, when moving onto the "closed loop" stage, the bit switches of the MSB (or the bit under test) remains closed, and bit switches for the lower bits are selectively closed based on the output of the comparator, one bit at a time. The switching sequence then proceeds with a closed-loop series of bit trials where the reservoir caps of the lower bits underneath the bit under test are, one by one, each inserted according to the comparator decision (closed loop).

After performing the first phase and the second phase, the calibration sequencer can record two patterns of ones and zeros of how the reservoir caps are inserted (e.g., right-side up or upside down). The difference of the two patterns represents the actual or effective weight of the bit under test. Based on the effective weight, it is possible to generate a word that represents the error of the bit under test, or an error coefficient which can be used to compensate or correct for the error of the bit under test. This switching sequence can be performed for each bit for which the effective weight of the bit is to be measured.

A Second Exemplary Technique: Without Using a Plurality of Predetermined Inputs

One characteristic associated with the first technique for measuring the individual bit weight errors is the application of a plurality of specific input voltages to force the SAR ADC to expose all error sources associated each of the bits under test. This characteristic does not easily lend itself to a self-calibration of the errors in the SAR ADC. Of the plurality of voltages required by the first technique, the input voltage of $V_{REF}/2$ or half full scale used for testing the MSB was one that can be easy to generate. A second exemplary technique for measuring the bit weight errors is based on the premise that if somehow the system could be setup such that the bit under test appears as if it is the MSB of the array, then that bit under test be calibrated with $V_{REF}/2$ applied to the two inputs, or any suitable differentially zero inputs. One way to make a bit appear to be the MSB of the array is to ensure that all reservoir capacitors of the more significant bits are discharged (or made to deliver substantially no charge) and placed in the array just prior to exercising the bit under test for its error. A differentially zero input pair can be used because the charge of the bit(s) that are more significant than the bit under test is no longer making a contribution to the SAR ADC, and thus does not need to be cancelled out using a specific input voltage that matches up with the bit weight(s) of those more significant bits. Effectively, the varying impedance and topology of the system is the same as if the SAR ADC was performing a normal conversion, but the weight of the more significant bits are removed so that the predetermined input does not need to balance the weight of the more significant bits to expose the bit weight of the bit under test.

Figure 24:
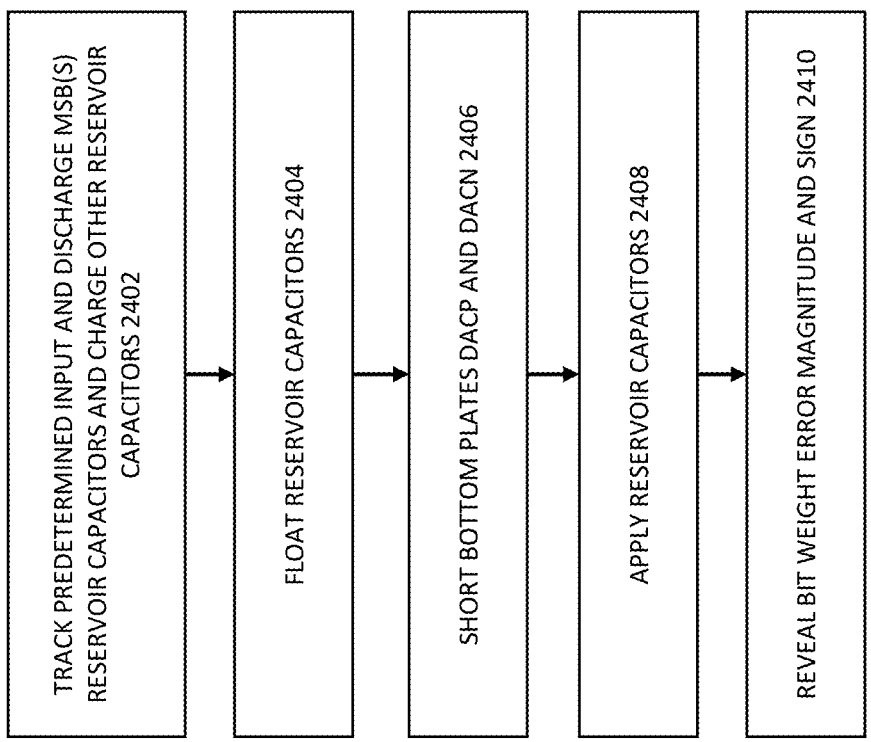
FIG. 24 shows a flow diagram illustrating another detailed method for measuring bit weight errors of a SAR ADC, according to some embodiments of the disclosure.

FIG. 24 shows a flow diagram illustrating another detailed method for measuring bit weight errors of a SAR ADC, according to some embodiments of the disclosure. At a high level, the second exemplary technique exposes the effective weights of the bits by forcing the SAR ADC to discharge the more significant reservoir caps but inserted in the same way during a normal conversion sequence. When measuring the error associated with any bit under test, the technique applies a predetermined input voltage to the bottom plates of the bit caps to track the input, and at the same time, charges reservoir capacitors of the lower bits but discharges all the more significant bits (box 2402). The technique then floats the reservoir capacitors (box 2404), and shorts the bottom plates of BitCapp's and BitCapn's (box 2406).

The reservoir caps are applied into the system with the bit under test reservoir capacitor inserted right-side up and all remaining reservoir caps applied up-side down (box 2408). A measure of the difference between the top plate voltages topp and topn reveals the sign and magnitude that the bit under tests contribution to that error (box 2410). After that measurement is taken the process is repeated again but this time with all of the reservoir capacitors reversed (box 2408). A measure of the difference between the top plate voltages reveals the sign and magnitude of all the other bits that contribute to the error (box 2410). Superposition applies in this SAR ADC therefore the difference of the two measurements reflects the total error and sign of that error for the bit under test. All bits to be calibrated can be measured in this manner. In some embodiments, it is possible to utilize the conversion process in a closed loop manner to expose the effective weight of the bit under test by appropriately setting all the lower bits to complement the more significant bit. In such embodiments, the lower bits can "weight" the more significant bit.

Considering a simplified method for measuring a first bit weight error of a first bit and a second bit weight error of a second bit, measuring the first bit weight error associated with the first bit capacitors and the first on-chip reservoir comprises sampling a first predetermined input using the first circuitry. Furthermore, measuring the second bit weight error associated with the second bit capacitors and the second on-chip reservoir comprises sampling a second predetermined input using the second circuitry, wherein the second predetermined input is the same of the first predetermined input. In some cases, the first predetermined input comprises a differential input signal and/or the second predetermined input comprises the same differential input signal. For instance, the first predetermined input is differentially zero, and the second predetermined input is differentially zero. One convenient differentially zero input usable for the first predetermined input and the second predetermined input is a pair of midscale voltages (e.g., ½ FS and ½ FS), but other suitable differentially zero input voltages can be used (e.g., any two voltages which are the same, or differentially zero).

Advantageously the calibration technique does not require a plurality of precisely generated voltages for the predetermined input. In some cases, the predetermined input can be generated on-chip, which makes the SAR ADC self-calibrating without requiring a series of predetermined inputs to get provided externally. To expose the effective bit weight of the second bit without using different input voltages, the technique involves discharging the first reservoir capacitor of the first circuitry (or configured to deliver no charge to the SAR ADC) before measuring the second bit weight error associated with the second bit capacitors and the second on-chip reservoir capacitor. To emulate the conversion process, the discharged reservoir capacitor continues to be inserted during the calibration process. Specifically, the first discharged reservoir capacitor is connected to the bottom plates of the first bit capacitors before and/or when measuring the second bit weight error associated with the second bit capacitors and the second on-chip reservoir capacitor.

FIGS. 25-30 illustrate a series of switching steps for measuring bit weight errors of a successive-approximation register analog-to-digital converter (SAR ADC), according to some embodiments of the disclosure. For illustration, the figures show the state of switches for the MSB and the next lower bit MSB-1. It is envisioned that there can be more circuitry for other lower MSBs. Furthermore, the figures show how MSB-1 can be measured without using an input voltage that is different from the one used for measuring the bit weight error of MSB. It is understood by one skilled in the art that the switching steps can be applied to measure the bit weight error of the lower bits as well. Similar to FIG. 7, these figures show comparator 602 and sample switches 610*a-b*. The figures further shows bit caps, MSB Bitcapp 1040, MSB Bitcapn 1050, MSB-1 BitCapp 1060, and MSB-1 BitCapn 1070, and respective circuitries for generating a bit using those bit caps. The MSB circuitry has MSB reservoir cap 1080, and the MSB-1 circuitry has MSB-1 reservoir cap 1090. The circuitry for the MSB include precharge switches 1002*a-b*, input switches 1006*a-b*, right-side up switches 1010*a-b*, upside down switches 1012*a-b*, and shorting switch 1020. The circuitry for the MSB-1 include precharge switches 1004*a-b*, input switches 1008*a-b*, right-side up switches 1014*a-b*, upside down switches 1016*a-b*, and shorting switch 1030.

The switching sequence for measuring the bit weight error of one bit can have two phases, where a first phase inserts the reservoir cap of the bit under test one way, and second phase after the first phase inserts the reservoir cap of the bit under test the other way. FIGS. 25-30 illustrate some switching of the first phase.

Figure 25:
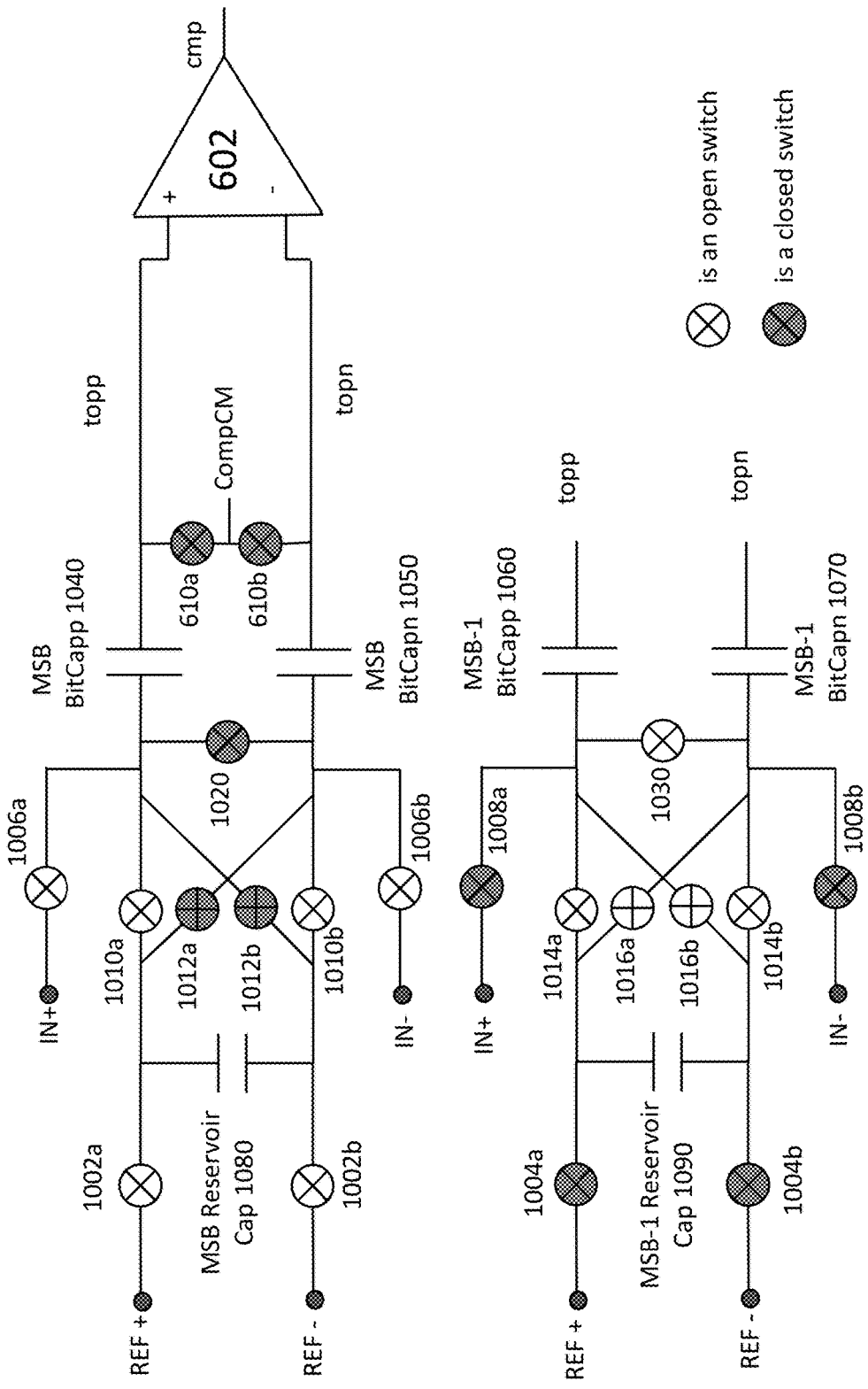
FIGS. 25-30 illustrate a series of switching steps for measuring bit weight errors of a successive-approximation register analog-to-digital converter (SAR ADC), according to some embodiments of the disclosure.

Referring to FIG. 25, the SAR ADC goes into an "acquisition and reservoir capacitor refresh but discharge MSB reservoir cap" stage. In this stage, instead of the charging the acquisition and reservoir refresh of the first technique, this second technique discharges all of the reservoir cap(s) of the more significant bit(s) (e.g., bits which were previously under test, bits that are higher than the bit under test). Specifically, in this example, because MSB-1 is the bit under test, the MSB reservoir capacitor 1080 is discharged by keeping the upside down switches 1012*a* closed and closing the shorting switch 1020. Note that the upside down switches 1012*a-b* were closed at the end of measuring the bit weight error of the MSB. While it is possible to discharge the MSB reservoir capacitor 1080 by closing the right-side up switches 1010*a-b*, by simply keeping the upside down switches 1012*a* closed reduces the amount of switching (and thereby reduces power consumption and complexity). If the right-side up switches 1010*a-b* were the bit switches that were closed at the end of measuring the bit weight error of the MSB, then this stage can alternatively keep the right-side up switches 1010*a-b* closed and close the shorting switch to discharge the MSB reservoir cap 1080. The reservoir capacitors (i.e., MSB-1 reservoir cap 1090, and any reservoir cap below MSB-1) are charged by means of closing precharge switches 1002*a-b* and 1004*a-b* and other corresponding switches in the lower bits. At the same time period, the bit caps are tracking the input by means of closing sample switches 610*a-b* and input switches 1008*a-b* (and corresponding switches in the lower bits).

In an alternative embodiment, rather than discharging the reservoir cap(s) of the more significant bit(s), the reservoir capacitor(s) of the more significant bit(s) can be configured such that the reservoir capacitor(s) of the more significant bit(s) delivers no charge to the bit capacitors of those more significant bit(s). For instance, each of the reservoir capacitor(s) of the more significant bit(s) can be "split into two halves", and insert the two halves in opposition, so they effectively cancel. Switches can be configured to connect one half right-side up, the other half upside down. Note that a reservoir capacitor are usually made up of many smaller capacitors, and for this reason, the reservoir capacitor can be split into two sets of smaller capacitors. When the two sets of smaller capacitors are inserted in with opposite orientations, substantially no charge is delivered from the reservoir capacitor to the bit caps, thereby effectively removing the weight of the more significant bits to make the bit under test appear as the most significant bit.

Figure 26:
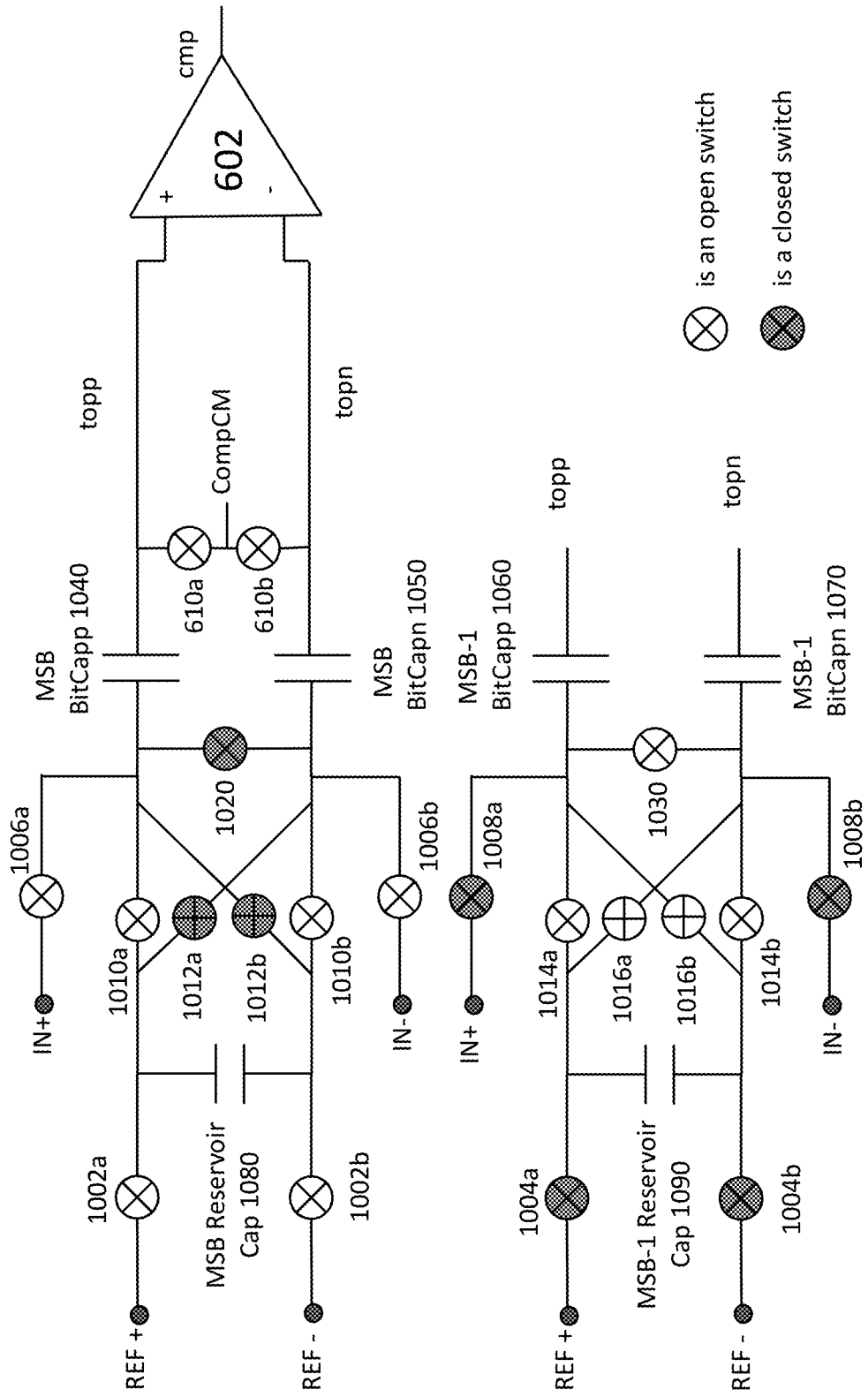

Referring to FIG. 26, the SAR ADC goes into "take the sample" stage. In this stage, the input voltage is sampled onto the bit caps, MSB BitCapp 1040, MSB BitCapp 1050, MSB-1 BitCapp 1060, MSB-1 BitCapn 1070, and so forth, by means of opening sample switches 610*a-b*.

Figure 27:
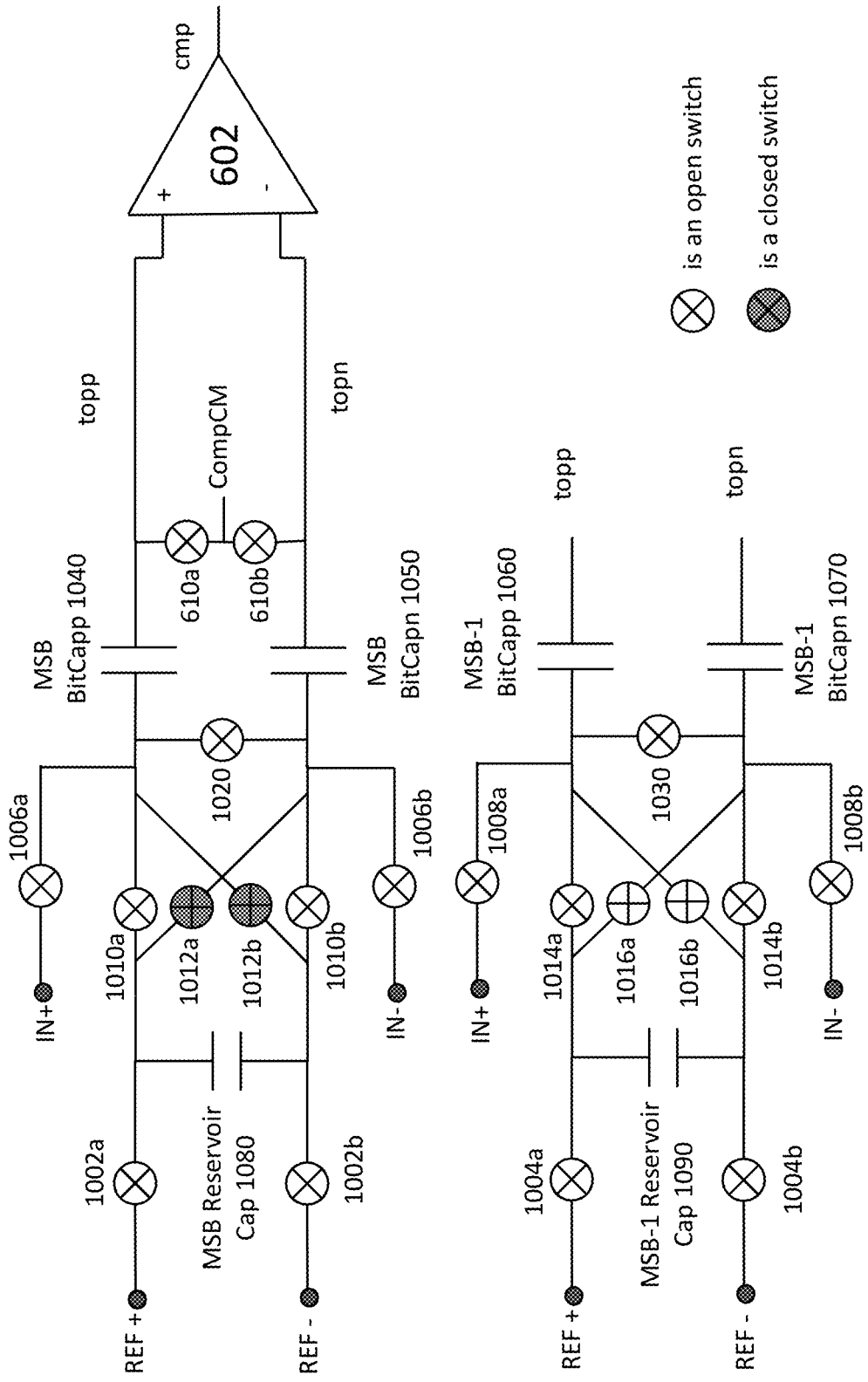

Referring to FIG. 27, the SAR ADC goes into "disconnect from the outside world" stage. In this stage, the reservoir caps ((discharged) MSB reservoir cap 1080, MSB-1 reservoir cap 1090), MSB BitCapp 1040, MSB BitCapp 1060, MSB-1 BitCapp 1060, MSB-1 BitCapn 1070, and so forth, are no longer connected to the (outside) reference REF+ and REF−, by means of opening the precharge switches 1002*a-b* and 1004*a-b* (and so on). The charge is trapped in the on-chip reservoir capacitors (in this example, the MSB-1 reservoir cap 1090), and are said to be "floating", or the step is construed as "floating the reservoir capacitors". During this stage, the discharged reservoir cap remains inserted, and the shorting switch 1020 is opened. Effectively, the discharged MSB reservoir cap 1080 is connected to the bottom plates of MSB BitCapp 1040 and MSB BitCapn 1050. There is no charge available on the bottom plates to denote whether to keep the bit or throw away the bit. But the discharge reservoir capacitor sits between the two bit caps, the impedance looking back towards the bottom plate looks proper to get the right error word. When a discharged reservoir cap remains inserted when measuring the bit weight error of MSB-1, MSB-1 behaves as if it is the MSB of the array and present all the right errors to the array without having to use specially generated voltages.

Figure 28:
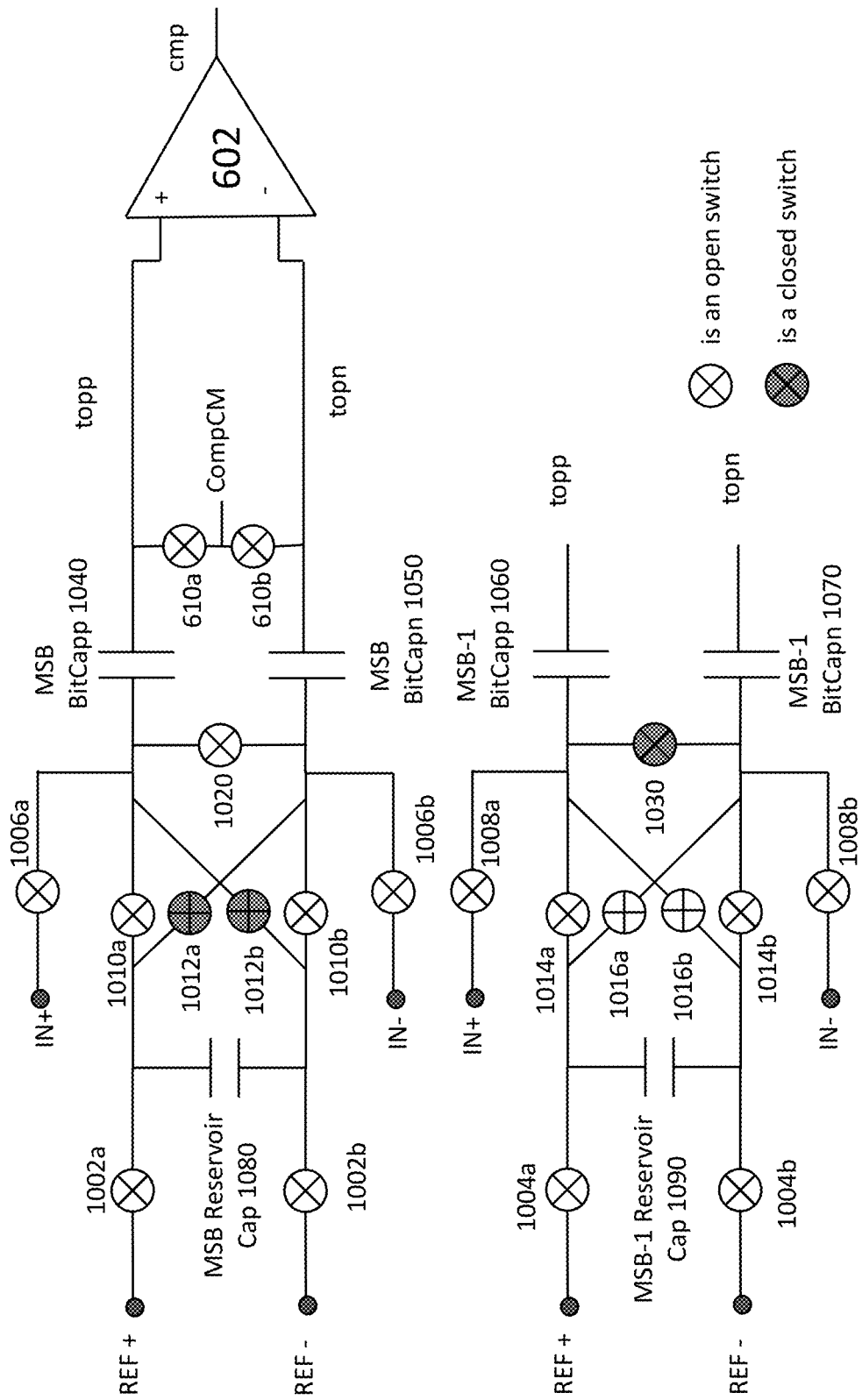

Referring to FIG. 28, the SAR ADC goes into "close shorting switches" stage. In this stage, the shorting switch 1030 (and so forth for the other shorting switches for the lower bits) are closed to transfer the sampled input voltage from the bottom plates of the bit caps to the top plate nodes (top and topn). After the shorting switch(es) are closed, voltages of topp and topn move up and down.

Figure 29:
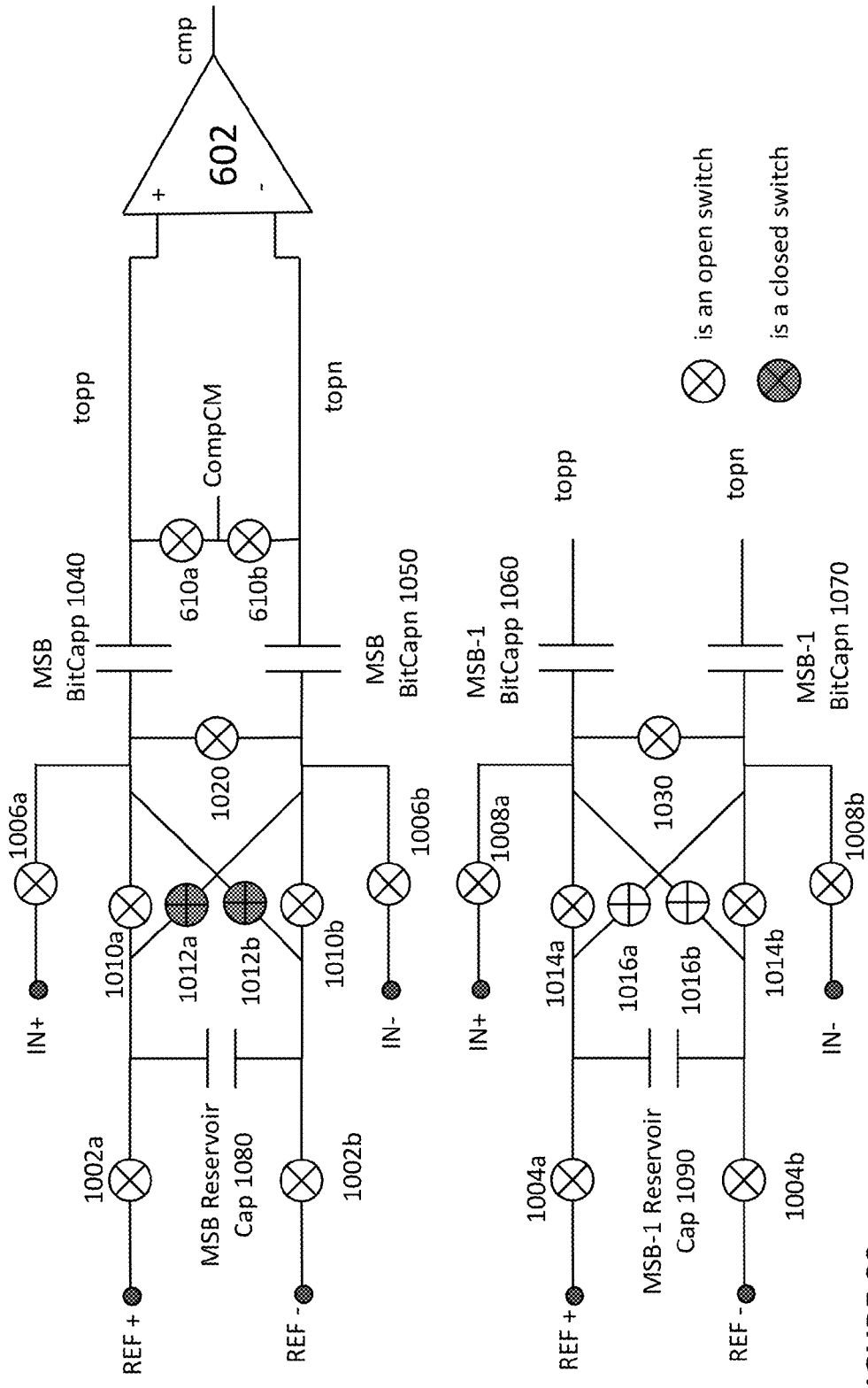

Referring to FIG. 29, the SAR ADC goes into "open the MSB-1 shorting switch" stage. In this stage, the shorting switch of the bit under test is opened. Note that in a normal conversion process, when voltages of topp and topn moved when shorting switches closed, the output cmp of comparator 602 is used by a calibration sequencer to decide whether to insert the MSB-1 reservoir cap 1090 right-side up or upside down. Before the MSB-1 reservoir cap 1090 can be inserted, the shorting switch has to be opened first (otherwise the right-side up switches or the up-side down switches being closed when the shorting switch is closed discharges the reservoir cap). Note the MSB reservoir cap 1080 remains inserted and connected to the bottom plates of MSB BitCapp 1040 and MSB BitCapn 1050.

Figure 30:
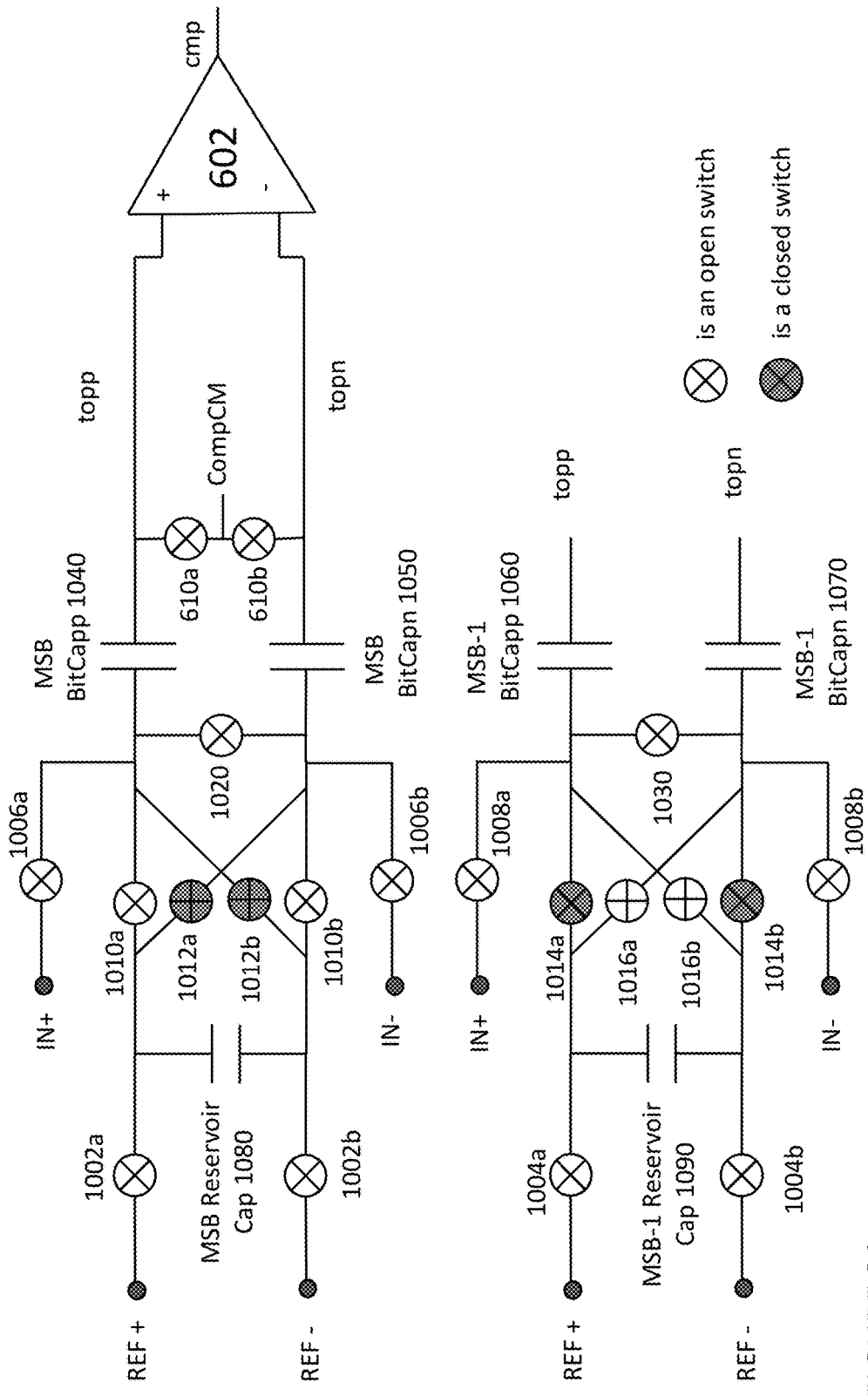

Referring to FIG. 30, the SAR ADC goes into "insert in the reservoir cap for bit under test" stage. For calibration, the output of the comparator and the conversion sequencer are ignored. The calibration sequencer inserts the MSB-1 reservoir cap 1090 (or reservoir cap of the bit under test) one way, in this example, right-side up (although it can be inserted upside down instead).

The calibration technique continues on by inserting the reservoir caps of the lower bits according to the output of the comparator for close loop operation, and then returns to perform the second phase while keeping the MSB reservoir cap 1080 discharged and inserted to measure the bit weight error and the MSB-1 Reservoir Cap 1090 inserted upside down.

After performing the first phase and the second phase, the calibration sequencer can record two patterns of ones and zeros of how the reservoir caps are inserted (e.g., right-side up or upside down). The difference of the two patterns represents the actual or effective weight of the bit under test. Based on the effective weight, it is possible to generate a word that represents the error of the bit under test, or an error coefficient which can be used to compensate or correct for the error of the bit under test. This switching sequence can be performed for each bit for which the effective weight is to be measured.

Process of Making Measurements and Processing of the Resulting Measurements to Generate Error Coefficients As explained above, the two techniques both involve making two measurements for each bit under test. In the first measurement, the reservoir capacitor for the bit under test is "right-side-up". If all capacitors were perfect binarily weighted capacitors, no residue charge is expected. However, because the SAR ADC itself is not perfect, it is possible the first measurement may include an "offset", e.g., due to switch charge injection or other artifacts. To reject that "offset", a second measurement is made by repeating the process in the "opposite", via the concept of correlated double-sampling (CDS). In the second measurement, the reservoir capacitor for the bit under test is "upside-down". By taking the difference between the measurements, any fixed "offset" can be rejected while exposing the effective "weight" of the bit under test (which is the difference between applying it "right-side-up" versus "upside-down").

Since the lesser bits themselves likely have imperfect weights, the estimate for any bit can include errors from the lesser bits. If desired, the measurements for all the tested bits can be used as inputs to a mathematical analysis to derive the actual weight of a particular bit. For instance, the actual weights can be derived by analysis of the ensemble of measurements (e.g., Gaussian elimination, matrix inversion, or other mathematical procedure). Phrased differently, the 'un-calibrated' lesser bits are used to measure the "effective weights" of more-significant bits, the calibration process may include some digital processing to derive error coefficients.

Once the effective weights of the various bits under test, which reflects the error of the bit, are measured, the effective weights can be used to generate error coefficients usable for compensating or correcting the error.

In some cases, a multiplicity of measurements (e.g., making further measurements beyond CDS) are made to filter out any measurement noise.

Variations and Implementations

While the description of the techniques generally start from the MSB, and proceeds to MSB-1, MSB-2, and so on, it is noted that the effective weight of the bits-to-be-calibrated can be measured in any order. The result is an equivalent process for calibrating an SAR ADC with reservoir capacitors and using the decide-and-set switching procedure.

The present disclosure describes "on-chip reservoir capacitors" as capacitors that are provided for each bit on the same semiconductor substrate as the SAR ADC, which can greatly improve the speed of conversion. It is understood by one skilled in the art that other equivalent embodiments may exist where the distance of the reservoir capacitor is brought closer to the SAR ADC but yet not necessarily on the same semiconductor substrate as the SAR ADC. For instance, it is envisioned by the disclosure that the reservoir capacitors (as decoupling capacitors) can be provided in the same package or circuit packaging as the SAR ADC.

In certain contexts, the SAR ADC discussed herein can be applicable to medical systems, scientific instrumentation, wireless and wired communications, radar, industrial process control, audio and video equipment, instrumentation (which can be highly precise), and other systems that can use an SAR ADC. Areas of technology where SAR ADCs can be used include communications, energy, healthcare, instrumentation and measurement, motor and power control, industrial automation and aerospace/defense. In some cases, the SAR ADC can be used in data-acquisition applications, especially when multiple channels require input multiplexing.

In the discussions of the embodiments above, the capacitors, clocks, DFFs, dividers, inductors, resistors, amplifiers, switches, digital core, transistors, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure.

Parts of various apparatuses for implementing a calibration sequence can include electronic circuitry to perform the functions described herein. In some cases, one or more parts of the apparatus can be provided by a processor specially configured for carrying out the functions described herein. For instance, the processor may include one or more application specific components, or may include programmable logic gates which are configured to carry out the functions describe herein. The circuitry can operate in analog domain, digital domain, or in a mixed signal domain. In some instances, the processor may be configured to carrying out the functions described herein by executing one or more instructions stored on a non-transitory computer medium.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In some embodiments, the electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the calibration functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims (if any) or examples. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims (if any) or examples. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related to calibrating an SAR ADC, illustrate only some of the possible functions that may be executed by, or within, systems illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims (if any) or examples. Note that all optional features of the apparatus described above may also be implemented with respect to the method or process described herein and specifics in the examples may be used anywhere in one or more embodiments.

EXAMPLES

Example 1

A method for measuring bit weight errors of a successive-approximation register analog-to-digital converter (SAR ADC), the SAR ADC using decide-and-set switching and having on-chip reservoir capacitors being used in individual bit decisions, the method comprising: measuring a first bit weight error associated with first bit capacitors and a first on-chip reservoir capacitor of first circuitry for generating a first bit of the SAR ADC; and measuring a second bit weight error associated with second bit capacitors and a second on-chip reservoir capacitor of second circuitry used for generating a second bit of the SAR ADC; wherein the second bit weight error is independent from the first bit weight error.

Example 2

The method of Example 1, further comprising: generating and storing only one calibration word per bit of the SAR ADC.

Example 3

The method of any one of the above Examples, wherein: measuring the first bit weight error comprises exposing a first effective weight of the first bit of the SAR ADC; and/or measuring the second bit weight error comprises exposing a second effective weight of the second bit of the SAR ADC.

Example 4

The method of any one of the above Examples, wherein: measuring a first bit weight error associated with the first bit capacitors and the first on-chip reservoir comprises sampling a first predetermined input using the first circuitry; and measuring a second bit weight error associated with the second bit capacitors and the second on-chip reservoir comprises sampling a second predetermined input using the second circuitry, wherein the second predetermined input is different from the first predetermined input.

Example 5

The method of any one of the above Examples, wherein the first predetermined input comprises a first differential input signal and/or the second predetermined input comprises a second differential input signal.

Example 6

The method of any one of the above Examples, wherein: the first predetermined input corresponds to the to zero or more bit weights of bits of the SAR ADC which are more significant than the first bit; and the second predetermined input corresponds to the to zero or more bit weights of bits of the SAR ADC which are more significant than the second bit.

Example 7

The method of any one of the above Examples, wherein: measuring the first bit weight error associated with the first bit capacitors and the first on-chip reservoir comprises sampling a first predetermined input using the first circuitry; and measuring the second bit weight error associated with the second bit capacitors and the second on-chip reservoir comprises sampling a second predetermined input using the second circuitry, wherein the second predetermined input is the same of the first predetermined input.

Example 8

The method of any one of the above Examples, wherein: the first predetermined input is differentially zero; and the second predetermined input is differentially zero.

Example 9

The method of any one of the above Examples, further comprising: discharging the first reservoir capacitor of the first circuitry before measuring the second bit weight error associated with the second bit capacitors and the second on-chip reservoir capacitor.

Example 10

The method of any one of the above Examples, further comprising: connecting the first discharged reservoir capacitor to the bottom plates of the first bit capacitors before and/or when measuring the second bit weight error associated with the second bit capacitors and the second on-chip reservoir capacitor.

Example 11

The method of any one of the above Examples, further comprising: configuring the first reservoir capacitor and connecting the first reservoir capacitor such that the first reservoir capacitor delivers no charge to the first bit capacitors before and/or when measuring the second bit weight error associated with the second bit capacitors and the second on-chip reservoir capacitor.

Example 12

An apparatus for measuring bit weight errors of a successive-approximation register analog-to-digital converter (SAR ADC), the SAR ADC using decide-and-set switching and having on-chip reservoir capacitors being used in individual bit decisions, the apparatus comprising: means for measuring a first bit weight error associated with first bit capacitors and a first on-chip reservoir capacitor of first circuitry for generating a first bit of the SAR ADC; and means for measuring a second bit weight error associated with second bit capacitors and a second on-chip reservoir capacitor of second circuitry used for generating a second bit of the SAR ADC; wherein the second bit weight error is independent from the first bit weight error.

Example 13

The apparatus of Example 12, wherein: the means for measuring the first bit weight error comprises means for exposing a first effective weight of the first bit of the SAR ADC; and/or the means for measuring the second bit weight error comprises means for exposing a second effective weight of the second bit of the SAR ADC.

Example 14

The apparatus of Example 12 or 13, wherein: the means for measuring a first bit weight error associated with the first bit capacitors and the first on-chip reservoir comprises means for sampling a first predetermined input using the first circuitry; and the means for measuring a second bit weight error associated with the second bit capacitors and the second on-chip reservoir comprises means for sampling a second predetermined input using the second circuitry, wherein the second predetermined input is different from the first predetermined input.

Example 15

The apparatus of any one of Examples 12-14, further comprising: means for generating the first predetermined input and the second predetermined input.

Example 16

The apparatus of any one of Examples 12-15, wherein: the first predetermined input corresponds to the to zero or more bit weights of bits of the SAR ADC which are more significant than the first bit; and the second predetermined input corresponds to the to zero or more bit weights of bits of the SAR ADC which are more significant than the second bit.

Example 17

The apparatus of any one of Examples 12-16, wherein: the means for measuring the first bit weight error associated with the first bit capacitors and the first on-chip reservoir comprises means for sampling a first predetermined input using the first circuitry; and the means for measuring the second bit weight error associated with the second bit capacitors and the second on-chip reservoir comprises means for sampling a second predetermined input using the second circuitry, wherein the second predetermined input is the same of the first predetermined input.

Example 18

The apparatus of any one of Examples 12-17, wherein: the first predetermined input is differentially zero; and the second predetermined input is differentially zero.

Example 19

The apparatus of any one of Examples 12-18, further comprising: means for discharging the first reservoir capacitor of the first circuitry before measuring the second bit weight error associated with the second bit capacitors and the second on-chip reservoir capacitor.

Example 20

The apparatus of any one of Examples 12-19, further comprising: means for connecting the first discharged reservoir capacitor to the bottom plates of the first bit capacitors before and/or when measuring the second bit weight error associated with the second bit capacitors and the second on-chip reservoir capacitor.

Example 21

The apparatus of any one of Examples 12-20, further comprising: means for configuring the first reservoir capacitor and connecting the first reservoir capacitor such that the first reservoir capacitor delivers no charge to the first bit capacitors before and/or when measuring the second bit weight error associated with the second bit capacitors and the second on-chip reservoir capacitor.

Example 22

The apparatus of any one of Examples 12-21, further comprising: means provided on-chip with the SAR ADC for generating the first predetermined input and the second predetermined input.

Example A

An apparatus comprising means for carrying out one or more of the functions described herein.

What is claimed is:

1. A method for measuring effective bit weights for calibrating a successive-approximation register analog-to-digital converter (SAR ADC) for digitizing an analog input of the SAR ADC, the method comprising:
measuring a first effective bit weight associated with first circuitry for generating a first bit of the SAR ADC, wherein during measuring of the first effective bit weight, first bit capacitors of the first circuitry sample the analog input of the SAR ADC and subsequently draw a first reference charge from a first on-chip reservoir capacitor of the first circuitry; and
after the first effective bit weight is measured, measuring a second effective bit weight associated with second circuitry for generating a second bit of the SAR ADC, wherein the second effective bit weight is isolated from the first effective bit weight and during the measuring of the second effective bit weight, second bit capacitors associated with the second bit of the second circuitry and other bit capacitors associated with bits less significant than the second bit sample the analog input of the SAR ADC against a common mode voltage and subsequently the second bit capacitors draw a second reference charge from a second on-chip reservoir capacitor of the second circuitry.

2. The method of claim 1, further comprising:
based on the first effective bit weight and the second effective bit weight, generating and storing only one calibration word for correcting a bit weight error of the first bit of the SAR ADC and only one calibration word for correcting the bit weight error of the second bit of the SAR ADC.

3. The method of claim 1, wherein:
top plates of the first and second bit capacitors are connectable to a comparator and the common mode voltage;
during the measuring of the first effective bit weight, bottom plates of the first bit capacitors are shorted together prior to drawing the first reference charge from the first on-chip reservoir capacitor; and
during the measuring of the second effective bit weight, bottom plates of the second bit capacitors are shorted together prior to drawing the second reference charge from the second on-chip reservoir capacitor.

4. The method of claim 1, wherein:
measuring the first effective bit weight comprises sampling a first predetermined input at the analog input of the SAR ADC using the first circuitry; and
measuring the second effective bit weight comprises sampling a second predetermined input at the analog input of the SAR ADC using the second circuitry;
the second predetermined input is different from the first predetermined input; and
the second predetermined input forces a comparator for the first bit to be at zero differential.

5. The method of claim 4, wherein the first predetermined input comprises a first differential input signal and the second predetermined input comprises a second differential input signal.

6. The method of claim 1, wherein:
measuring the second effective bit weight comprises sampling a predetermined input at the analog input of the SAR ADC using the second circuitry, the second predetermined input corresponding to one or more bit weights of bits of the SAR ADC which are more significant than the second bit including a bit weight of the first bit, so that the one or more bit weights of the bit(s) which are more significant than the second bit do not contribute to the second effective bit weight being measured.

7. The method of claim 1, wherein:
measuring the first effective bit weight comprises sampling a first predetermined input at the analog input of the SAR ADC using the first circuitry; and
measuring the second effective bit weight comprises removing the first effective bit weight from the measurement of the second effective bit weight and sampling the same first predetermined input at the analog input of the SAR ADC using the second circuitry.

8. The method of claim 7, wherein:
the first predetermined input is differentially zero.

9. The method of claim 1, wherein measuring the second effective bit weight comprises:
discharging the first reservoir capacitor of the first circuitry before measuring the second effective bit weight; and
connecting the first discharged reservoir capacitor to the bottom plates of the first bit capacitors before and/or when measuring the second effective bit weight.

10. The method of claim 1, further comprising:
disconnecting the first on-chip reservoir capacitor from a positive reference and a negative reference and subsequently inserting the first on-chip reservoir capacitor differentially between the first bit capacitors during the measurement of the first effective bit weight; and
disconnecting the second on-chip reservoir capacitor from the positive reference and the negative reference and subsequently inserting the second on-chip reservoir capacitor differentially between the second bit capacitors during the measurement of the second effective bit weight.

11. The method of claim 1, wherein measuring the second effective bit weight comprises:
configuring the first reservoir capacitor and connecting the first reservoir capacitor to the first bit capacitors such that the first reservoir capacitor delivers no charge to the first bit capacitors before and/or when measuring the second effective bit weight.

12. An apparatus for orthogonalizing bit weight errors of a successive-approximation register analog-to-digital converter (SAR ADC) for digitizing an analog input of the SAR ADC, the apparatus comprising:
    means for exposing a first effective bit weight of a first bit of the SAR ADC by sampling a first predetermined input at the analog input to the SAR ADC by first bit capacitors, subsequently drawing a first reference charge from a first on-chip reservoir capacitor dedicated to the first bit capacitors to the first bit capacitors; and
    means for exposing a second effective bit weight of a second bit of the SAR ADC after exposing the first effective weight of the first bit by removing contribution of the first bit to measurement of the second effective bit weight, sampling a second predetermined input at the analog input to the SAR ADC by second bit capacitors, subsequently drawing a second reference charge from a second on-chip reservoir capacitor dedicated to the second bit capacitors to the second bit capacitors, and setting bits less significant to the second bit to complement the second bit.

13. The apparatus of claim 12, wherein:
    sampling the first predetermined input at the analog input of the SAR ADC by the first bit capacitors comprises sampling the first predetermined input against a common mode voltage; and
    exposing the first effective bit weight further comprises, after disconnecting the first bit capacitors from the common mode voltage and the analog input of the SAR ADC and prior to drawing the first reference charge from the first on-chip reservoir capacitor, shorting the first bit capacitors together to allow a comparator connected to the first bit capacitors to output a decision for inserting the second on-chip reservoir capacitor in one of two ways.

14. The apparatus of claim 12, further comprising:
    means for recording bit trial results of the bits less significant to the first bit when the first bit effective weight of the first bit is being exposed;
    means for recording bit trial results of the bit less significant to the second bit when the second bit effective weight of the second bit is being exposed; and
    means for generating only two calibration words based on the bit trial results to calibrate the first bit and the second bit.

15. The apparatus of claim 12, further comprising:
    signal generating means for generating the first predetermined input and the second predetermined input.

16. The apparatus of claim 12, wherein removing contribution of the first bit comprises:
    generating the second predetermined input to correspond to one or more bit weights of bits of the SAR ADC which are more significant than the second bit including a bit weight of the first bit.

17. The apparatus of claim 12, wherein:
    the second predetermined input is the same as the first predetermined input.

18. The apparatus claim 17, further comprising:
    means provided on-chip with the SAR ADC for generating the first predetermined input and the second predetermined input, wherein the first predetermined input is differentially zero and the second predetermined input is differentially zero.

19. The apparatus of claim 12, wherein removing the contribution of the first bit comprises:
    configuring the first reservoir capacitor and connecting the first reservoir capacitor to the first bit capacitors such that the first reservoir capacitor delivers no charge to the first bit capacitors before and/or when measuring the second bit weight error associated with the second bit capacitors and the second on-chip reservoir capacitor.

20. A successive-approximation register analog-to-digital converter (SAR ADC), the SAR ADC comprising:
    circuitry to converting an analog input to the SAR ADC to a digital output comprising bit capacitors and reservoir capacitors, each reservoir capacitor provided for a different bit of the SAR ADC, wherein for at least one of the bit capacitors, the bit capacitor samples the analog input to the SAR ADC and draws reference charge from a reservoir capacitor provided for the bit capacitor; and
    a calibration sequencer to expose an effective bit weight of a second bit by implementing a switching sequence that:
        configures a first reservoir capacitor provided for a first bit to deliver no charge to a first bit capacitors associated with the first bit, and
        records decisions of bits lesser than the second bit balancing only the effective bit weight of the second bit, wherein the decisions are a measurement of the effective bit weight of the second bit.

21. The SAR ADC of claim 20, wherein the reservoir capacitors comprises:
    the first reservoir capacitor dedicated to first bit capacitors associated with the first bit; and
    a second reservoir capacitor dedicated to second bit capacitors associated with the second bit.

22. The SAR ADC of claim 20, the circuitry further comprises:
    a comparator connectable to the first bit capacitors, the second bit capacitors, and other bit capacitors for performing the decisions.

23. The SAR ADC of claim 20, wherein the switching sequence further implements the following steps:
    charging a second reservoir capacitor provided for the second bit with a positive reference and a negative reference;
    sampling the analog input by second bit capacitors and bit capacitors associated with bits lesser than the second bit against a common mode voltage;
    shorting of the second bit capacitors after sampling step; and
    connecting the first bit capacitors to the first reservoir capacitor and connecting second bit capacitors associated with the second bit to the second reservoir capacitor after the shorting step.

24. The method of claim 1, wherein:
    the first bit capacitors are connectable to the analog input of the SAR ADC and a comparator; and
    the second bit capacitors are connectable to the analog input of the SAR ADC and the comparator.

25. The method of claim 1, wherein:
    the first on-chip reservoir capacitor has top and bottom plates which are connectable to a positive reference and a negative reference respectively to store the first reference charge; and
    the second on-chip reservoir capacitor has top and bottom plates which are connectable to the positive reference and the negative reference respectively to store the second reference charge.

26. The method of claim 1, wherein during the measuring of the first effective bit weight, the first bit capacitors and other bit capacitors associated with bits less significant than the first bit sample the analog input of the SAR ADC against a common mode voltage prior to the first bit capacitors drawing the first reference charge.

* * * * *